(12) United States Patent
Jong et al.

(10) Patent No.: US 9,118,443 B2
(45) Date of Patent: Aug. 25, 2015

(54) SYSTEM AND METHOD FOR IMPROVED WAVEFORM AND ENHANCED RECEIVER ALGORITHM FOR HIGH PENETRATION ALERTING IN A MOBILE SATELLITE COMMUNICATIONS SYSTEM

(71) Applicant: Hughes Network Systems, Germantown, MD (US)

(72) Inventors: James Jehong Jong, North Potomac, MD (US); Harish Ramchandran, Germantown, MD (US); Jun Wang, Greenbelt, MD (US); Channasandra Ravishankar, Germantown, MD (US)

(73) Assignee: Hughes Network Systems, LLC, Germantown, MD (US)

( * ) Notice: Subject to any disclaimer, the term of this patent is extended or adjusted under 35 U.S.C. 154(b) by 0 days.

(21) Appl. No.: 14/045,771

(22) Filed: Oct. 3, 2013

(65) Prior Publication Data
US 2014/0093008 A1    Apr. 3, 2014

Related U.S. Application Data

(60) Provisional application No. 61/744,742, filed on Oct. 3, 2012.

(51) Int. Cl.
*H04J 11/00* (2006.01)
*H04L 1/00* (2006.01)
*H04L 5/00* (2006.01)
*H03M 13/15* (2006.01)
*H03M 13/37* (2006.01)
*H03M 13/45* (2006.01)
*H03M 13/00* (2006.01)

(52) U.S. Cl.
CPC ......... *H04L 1/0042* (2013.01); *H03M 13/1515* (2013.01); *H03M 13/373* (2013.01); *H03M 13/451* (2013.01); *H03M 13/6525* (2013.01); *H04L 1/0041* (2013.01); *H04L 1/0045* (2013.01); *H04L 1/0057* (2013.01); *H04L 1/0065* (2013.01); *H04L 5/0007* (2013.01)

(58) Field of Classification Search
None
See application file for complete search history.

(56) References Cited

U.S. PATENT DOCUMENTS 5,103,459 A * 4/1992 Gilhousen et al. ............ 370/206
6,279,132 B1 * 8/2001 Linsky et al. ................. 714/755

OTHER PUBLICATIONS

"International Search Report & Written Opinion", International Search Report & Written Opinion, PCT/US2013/063328, Jan. 7, 2014.

* cited by examiner

*Primary Examiner* — Leon-Viet Nguyen
(74) *Attorney, Agent, or Firm* — Potomac Technology Law, LLC

(57) ABSTRACT

An approach is provided for high penetration alerting in a mobile satellite system. A message is generated for transmission to a wireless terminal. The message is partitioned into a number of symbols, each symbol composed of a portion of the message. The symbols are encoded via FEC coding to generate outer coded symbols, and each outer coded symbol is encoded based on a corresponding binary orthogonal sequence. The inner coded symbols are modulated based on a binary modulation scheme, and pulse shaped to generate message bursts for transmission to the wireless terminal. Each message burst reflects a group of the inner coded symbols, wherein the grouping of the inner coded symbols facilitates joint sequence detection by the wireless terminal, and each message burst exhibits relatively low peak-to-average power ratio.

18 Claims, 22 Drawing Sheets

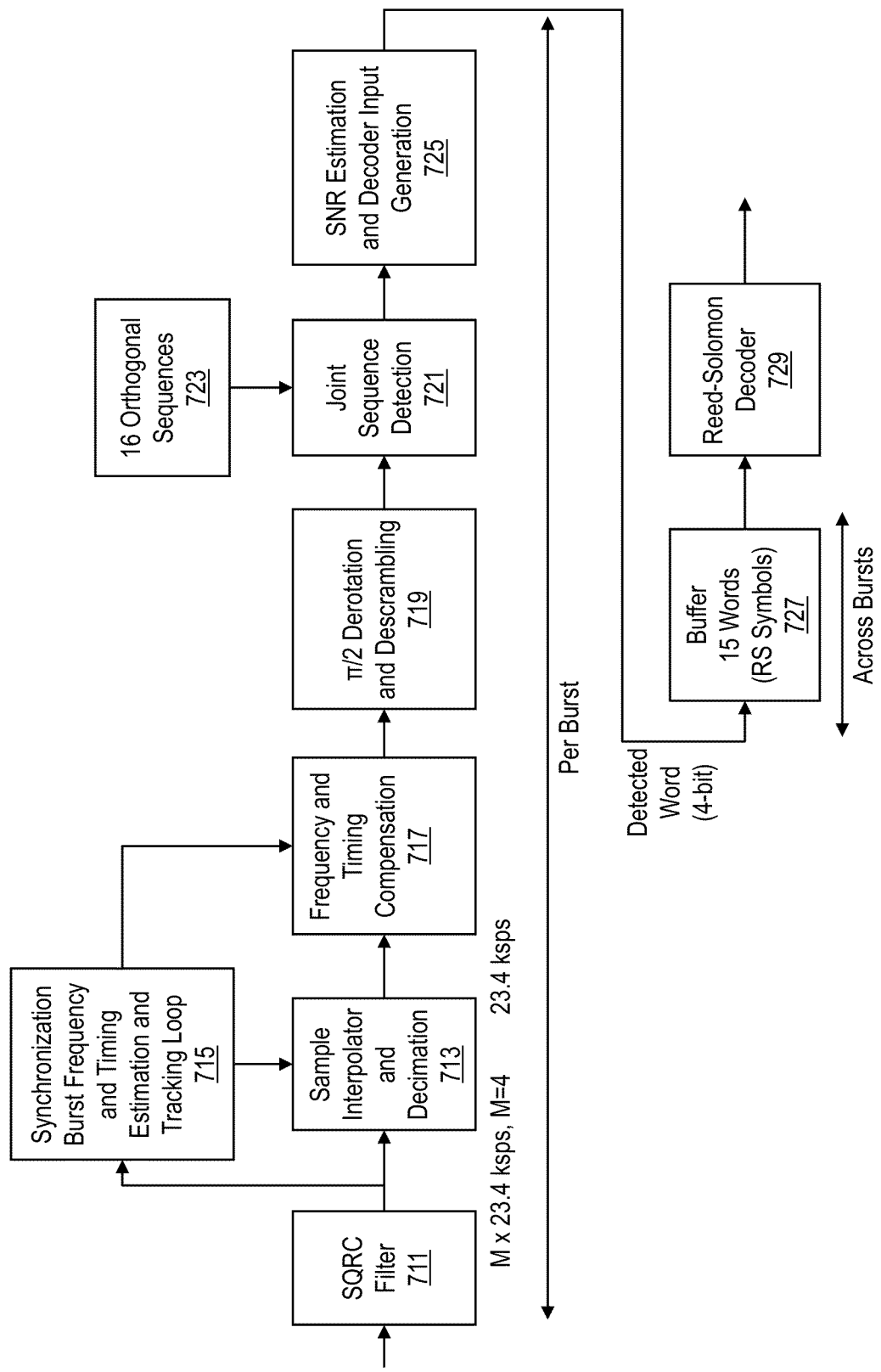

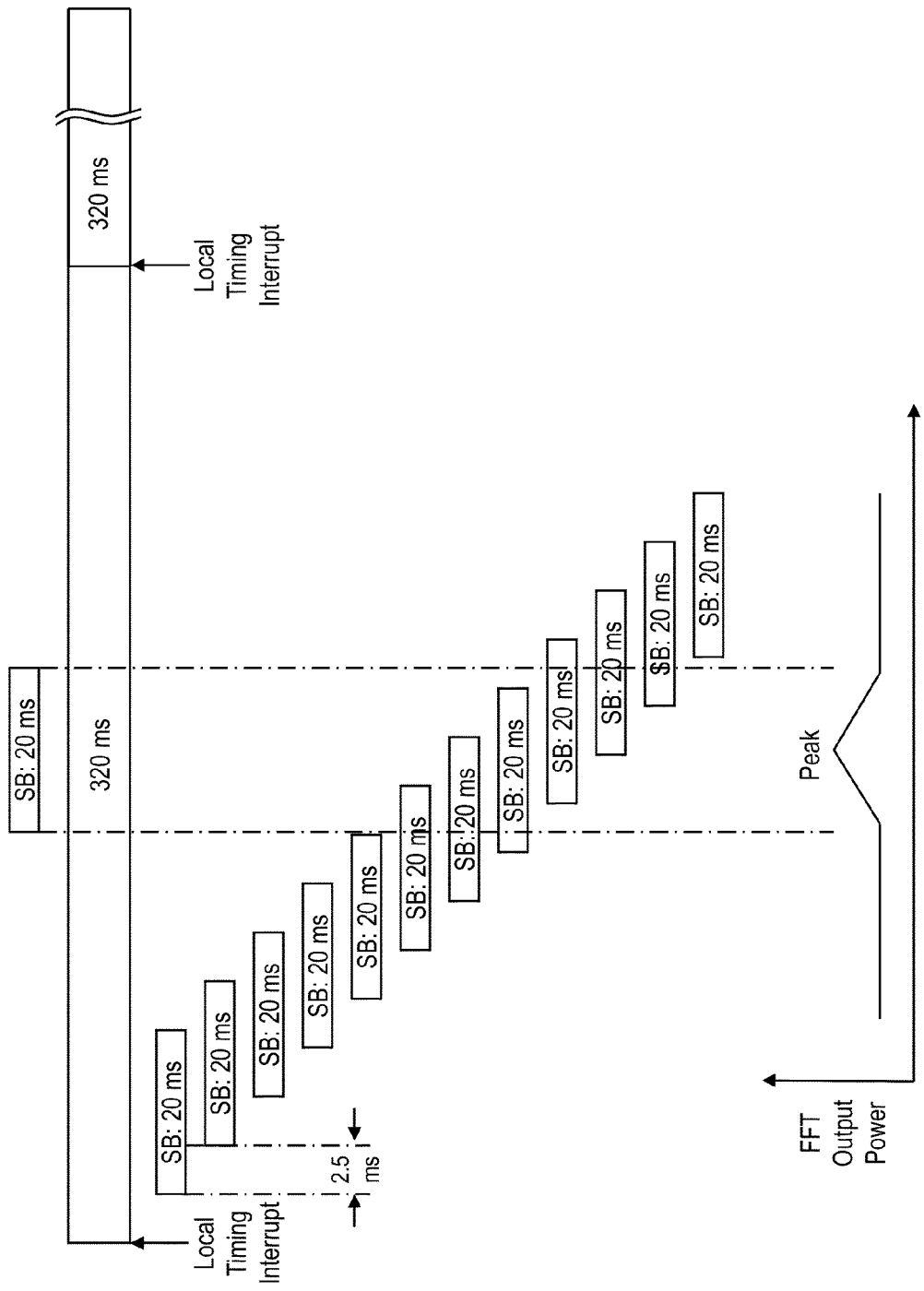

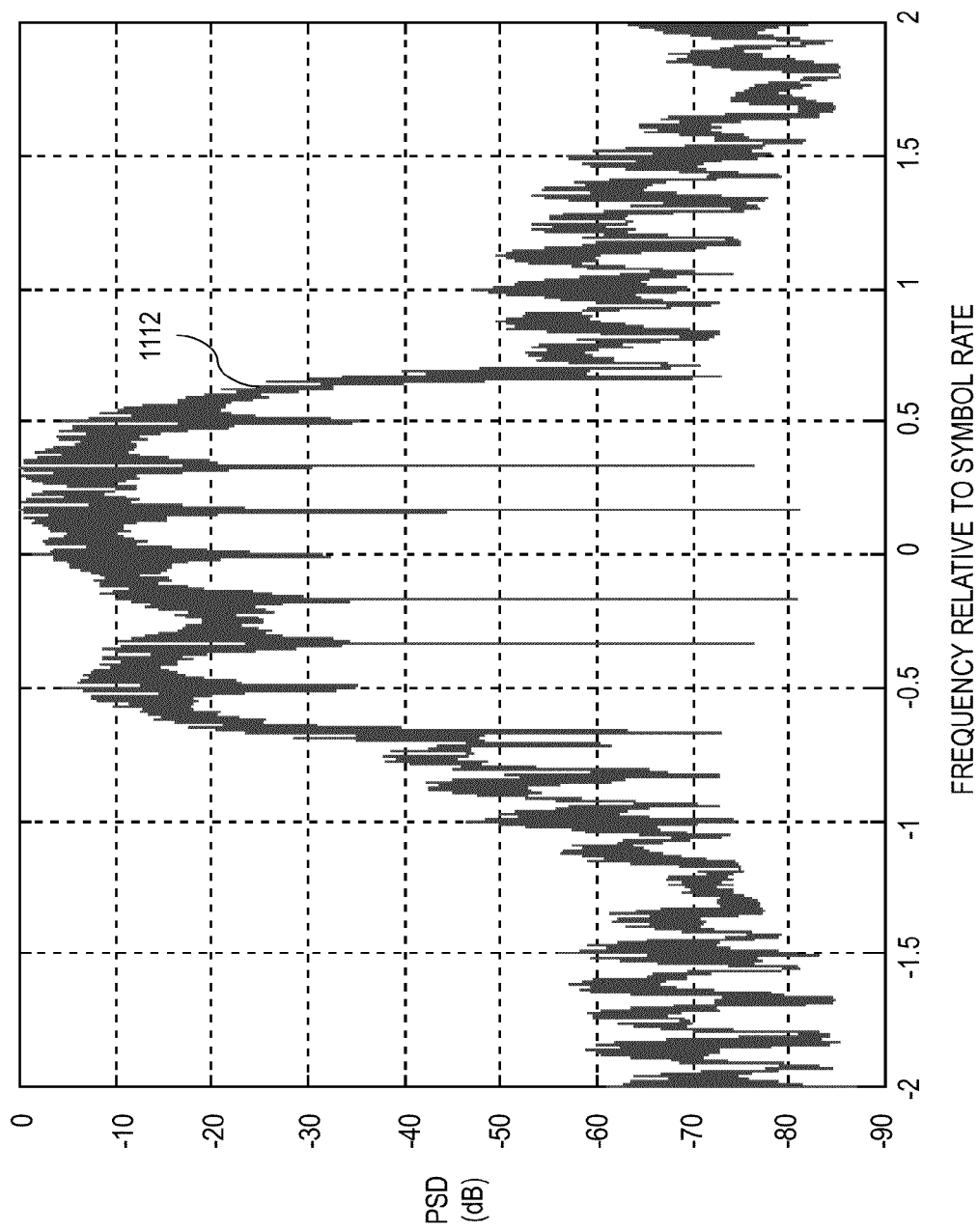

SYSTEM AND METHOD FOR IMPROVED WAVEFORM AND ENHANCED RECEIVER ALGORITHM FOR HIGH PENETRATION ALERTING IN A MOBILE SATELLITE COMMUNICATIONS SYSTEM

RELATED APPLICATIONS

This application claims the benefit of the earlier filing date under 35 U.S.C. §119(e) of U.S. Provisional Application Ser. No. 61/744,742 (filed 3 Oct. 2012).

BACKGROUND

The present invention relates generally to mobile satellite communication systems, and more particularly to a method and system for providing alert messaging to mobile terminals in high-attenuation propagation environments within a mobile satellite communications network.

Terrestrial communications systems continue to provide higher and higher speed multimedia (e.g., voice, data, video, images, etc.) services to end-users. Such services (e.g., Third Generation (3G) and Fourth Generation (4G) services) can also accommodate differentiated quality of service (QoS) across various applications. To facilitate this, terrestrial architectures are moving towards an end-to-end all-Internet Protocol (IP) architecture that unifies all services, including voice, over the IP bearer. In parallel, mobile satellite systems (MSS) are being designed to complement and/or coexist with terrestrial coverage depending on spectrum sharing rules and operator choice. With the advances in processing power of desktop computers, the average user has grown accustomed to sophisticated applications (e.g., streaming video, radio broadcasts, video games, etc.), which place tremendous strain on network resources. Internet services, as well as other IP services, rely on protocols and networking architectures that offer great flexibility and robustness; however, such infrastructure may be inefficient in transporting IP traffic, which can result in large user response time, particularly if the traffic has to traverse an intermediary network with a relatively large latency (e.g., a satellite network). To promote greater adoption of data communications services, the telecommunications industry, from manufacturers to service providers, has agreed at great expense and effort to develop standards for communications protocols that underlie the various services and features.

Satellite systems, however, pose unique design challenges over terrestrial systems. That is, mobile satellite systems have different attributes that make terrestrial designs either not applicable or inefficient for satellite systems. For example, satellite systems are characterized by long delays (as long as 260 ms one-way) between a user terminal device and a base station compared to the relatively shorter delays (e.g., millisecond or less) in terrestrial cellular systems—which implies that protocols on the satellite links have to be enhanced to minimize impact of long propagation delays. Additionally, satellite links typically have smaller link margins than terrestrial links for a given user-terminal power amplifier and antenna characteristics; this implies that higher spectral efficiency and power efficiency are needed in satellite links. Moreover, the satellite transmission or channel resources represent limited resources, where the deployment of additional transmission resources is significantly more expensive, difficult and time consuming as compared with terrestrial radio resources. Accordingly, the transmission resources of a satellite system must be used efficiently to maximize the available bandwidth, in order to provide the required quality of service for the extensive and diverse assortment of service applications available to the mobile user, and to maximize the number of potential users in a system without adversely affecting the quality of service.

Moreover, in mobile satellite communication systems, user terminals (UTs) (e.g., mobile terminals) typically employ a low gain omnidirectional antenna (e.g., of less than 6 dB gain). The antenna collects the transmission signal transmitted within the spot beam of an orbiting satellite, including the direct line-of-sight components of the signal and the specular ground reflection components near the terminal. The antenna also collects multipath reflection components of the direct signal from taller stationary objects such as trees, mountains, and buildings. Such reflection components can combine destructively when collected, and result in attenuation or fading of the signal. Further, more severe signal fading or attenuation may occur if the line-of-sight path between the mobile terminal and the orbiting satellite is blocked by a building or other object. This effect is called "shadowing." Under certain circumstances, therefore, where the shadowing and reflective factors may be enhanced (e.g., when the UT is within a metal-framed building, underground or otherwise experiencing severe signal fading or attenuation), the UT might be unable to receive a paging or alert signal transmitted by a network gateway via the satellite. The user or called party thus has no way of knowing that incoming calls are being lost. Accordingly, these factors contribute to lower success rates of conventional mobile terminated calls.

To address the problems associated with shadowing and reflective factors, current mobile satellite systems employ an alerting method to provide alert messaging to a mobile terminal being called, when the UT is within a heavily shadowed area. Alerting provides a high level announcement to a UT of a mobile terminated call, which provides the user with a notification and the opportunity to move to a less heavily shadowed area to receive the incoming call. Such an alerting method, as employed by current mobile satellite systems, is described in U.S. Pat. No. 5,974,092, titled "Method and System For Mobile Alerting in A Communication System." Current mobile communications systems, however, utilize a 6 PSK modulated signal waveform in conjunction with a conventional orthogonal sequence, exhibiting high peak to average power ratio and irregular power spectrum, which prohibits efficient power amplification. Such systems, therefore, fail to provide sufficient link margin to provide a reliable alert messaging approach under circumstances of high attenuation. Moreover, the burst structure and coding of such systems does not facilitate the use of joint sequence detection in the receiver and forces the use of hard decision based FEC decoding. The alert message burst format of such current systems is described in GMR-1 05.002 (ETSI TS 101 376-5-2): "GEO-Mobile Radio Interface Specifications; Part 5: Radio interface physical layer specifications; Sub-part 2: Multiplexing and Multiple Access; Stage 2 Service Description; GMR-1 05.002" (V-1.2.1) (hereinafter referred to as "ETSI TS 101 376-5-2"). The FEC channel coding employed in such current systems is described in GMR-1 05.003 (ETSI TS 101 376-5-3): "GEO-Mobile Radio Interface Specifications; Part 5: Radio interface physical layer specifications; Sub-part 3: Channel Coding; GMR-1 05.003" (V-1.2.1) (hereinafter referred to as "ETSI TS 101 376-5-3"). The modulated signal waveform of such current systems is further described in the European Telecommunications Standards Institute (ETSI) publication GMR-1 05.004 (ETSI TS 101 376-5-4): "GEO-Mobile Radio Interface Specifications; Part 5: Radio interface physical layer specifications; Sub-part 4: Modulation; GMR-1 05.004" (V-1.2.1) (hereinafter referred to as "ETSI TS 101 376-5-4"). Accordingly, the system and method of alert messaging in current mobile satellite communications systems fails to provide for optimal waveforms for high penetration alerting, and for receiver algorithms that facilitate joint sequence detection and soft decision decoding.

What is needed, therefore, is an approach for high penetration alerting in a mobile satellite communications system that employs an enhanced waveform design that exhibits lower peak-to-average power ratio and permits joint sequence detection. What is also needed, therefore, is and approach for high penetration alerting in a mobile satellite communications system that employs an enhanced receiver algorithm that facilitates computationally efficient joint sequence detection and soft decision decoding.

SOME EXEMPLARY EMBODIMENTS

The present invention advantageously addresses the foregoing requirements and needs, as well as others, by providing a system and method for reliable high penetration alerting in a mobile satellite communications system that employs an enhanced waveform design an enhanced receiver algorithm. The enhanced waveform, in accordance with exemplary embodiments of the present invention, exhibits lower peak-to-average power ratio and permits joint sequence detection. Further, the enhanced receiver algorithm, in accordance with exemplary embodiments of the present invention, facilitates computationally efficient joint sequence detection and soft decision decoding. According to exemplary embodiments, the present invention thereby provides for a reliable means for high penetration alerting, based on improved link margins due to enhanced waveform designs and receiver algorithms, for providing alert signal messaging to user terminals situated in highly power attenuated locations.

According to an example embodiment, a method comprises generating a message for transmission to a wireless terminal, wherein the message comprises a number of bits. The message is partitioned into a number of symbols, each symbol being composed of a distinct equal length portion of the message. The symbols are encoded via an FEC outer coding to generate a number of outer coded symbols, and each of the outer coded symbols is encoded based on an orthogonal sequence inner coding to generate a respective inner coded symbol, wherein each outer coded symbol is coded based on a distinct corresponding one of a plurality of binary orthogonal sequences. The inner coded symbols are modulated based on a binary modulation scheme, and pulse shaped to generate a plurality of message bursts for transmission to the wireless terminal. Each message burst reflects a group of a uniform number of the inner coded symbols, wherein the grouping of the inner coded symbols within the message bursts facilitates joint sequence detection by a receiver of the wireless terminal, and wherein each message burst exhibits relatively low peak-to-average power ratio. Further, the distinct corresponding binary orthogonal sequence, based upon which each outer coded symbol is encoded, is based on a value of the respective outer coded symbol, wherein each outer coded symbol is four bits in length, and the orthogonal sequence inner coding comprises a 16-ary coding based on sixteen binary orthogonal sequences with each sequence corresponding to a respective one of the potential four-bit values of the outer coded symbols. Additionally, the encoding of the outer coded symbols may further comprise scrambling each message burst based on a binary scrambling sequence. According to one embodiment, the message comprises 36 information bits, the message is partitioned into nine 4-bit symbols, the FEC outer coding generates fifteen 4-bit outer coded symbols, each message burst reflects a group of three of the inner coded symbols, and the binary modulation scheme comprises a $\pi/2$ BPSK scheme.

According to a further example embodiment, an apparatus comprises a processor module configured to generate a message for transmission to a wireless terminal, wherein the message comprises a number of bits, and to partition the message into a number of symbols, each symbol being composed of a distinct equal length portion of the message. The apparatus further comprises an encoder module configured to encode the symbols via an FEC outer coding to generate a number of outer coded symbols, and to encode each of the outer coded symbols based on an orthogonal sequence inner coding to generate a respective inner coded symbol, wherein each outer coded symbol is coded based on a distinct corresponding one of a plurality of binary orthogonal sequences. The apparatus also comprises a modulator module configured to modulate the inner coded symbols based on a binary modulation scheme, one or more pulse shaping filters to pulse shape the modulated inner coded symbols to generate a plurality of message bursts for transmission to the wireless terminal. Each message burst reflects a group of a uniform number of the inner coded symbols, wherein the grouping of the inner coded symbols within the message bursts facilitates joint sequence detection by a receiver of the wireless terminal, and wherein each message burst exhibits relatively low peak-to-average power ratio. Further, the distinct corresponding binary orthogonal sequence, based upon which each outer coded symbol is encoded, is based on a value of the respective outer coded symbol, wherein each outer coded symbol is four bits in length, and the orthogonal sequence inner coding comprises a 16-ary coding based on sixteen binary orthogonal sequences with each sequence corresponding to a respective one of the potential four-bit values of the outer coded symbols. Additionally, the encoding of the outer coded symbols may further comprise scrambling each message burst based on a binary scrambling sequence. According to one embodiment, the message comprises 36 information bits, the message is partitioned into nine 4-bit symbols, the FEC outer coding generates fifteen 4-bit outer coded symbols, each message burst reflects a group of three of the inner coded symbols, and the binary modulation scheme comprises a $\pi/2$ BPSK scheme.

Still other aspects, features, and advantages of the invention are readily apparent from the following detailed description, simply by illustrating a number of particular embodiments and implementations, including the best mode contemplated for carrying out the invention. The invention is also capable of other and different embodiments, and its several details can be modified in various obvious respects, all without departing from the spirit and scope of the invention. Accordingly, the drawings and description are to be regarded as illustrative in nature, and not as restrictive.

BRIEF DESCRIPTION OF THE DRAWINGS

The present invention is illustrated by way of example, and not by way of limitation, in the figures of the accompanying drawings, and in which like reference numerals refer to similar elements, and wherein:

FIG. 7 illustrates a block diagram of a demodulator and decoder of a UT or mobile terminal receiver, in accordance with an exemplary embodiment;

FIG. 8 illustrates an exemplary process whereby the mobile terminal or UT receiver acquires initial timing and frequency based on the synchronization burst, in accordance with an exemplary embodiment;

FIG. 11B illustrates a power spectrum density (PSD) plot of an alert message burst which has been coded utilizing a Reed-Solomon outer coding (in accordance with an exemplary embodiment) and a conventional orthogonal sequence without scrambling;

DETAILED DESCRIPTION

A system and method for reliable high penetration alerting in a mobile satellite communications system, which employs an enhanced waveform design an enhanced receiver algorithm, are provided. In the following description, for the purposes of explanation, numerous specific details are set forth in order to provide a thorough understanding of the embodiments of the invention. It is apparent, however, to one skilled in the art that the embodiments of the invention may be practiced without these specific details or with an equivalent arrangement. In other instances, well-known structures and devices are shown in block diagram form in order to avoid unnecessarily obscuring the embodiments of the invention.

Figure 1A:
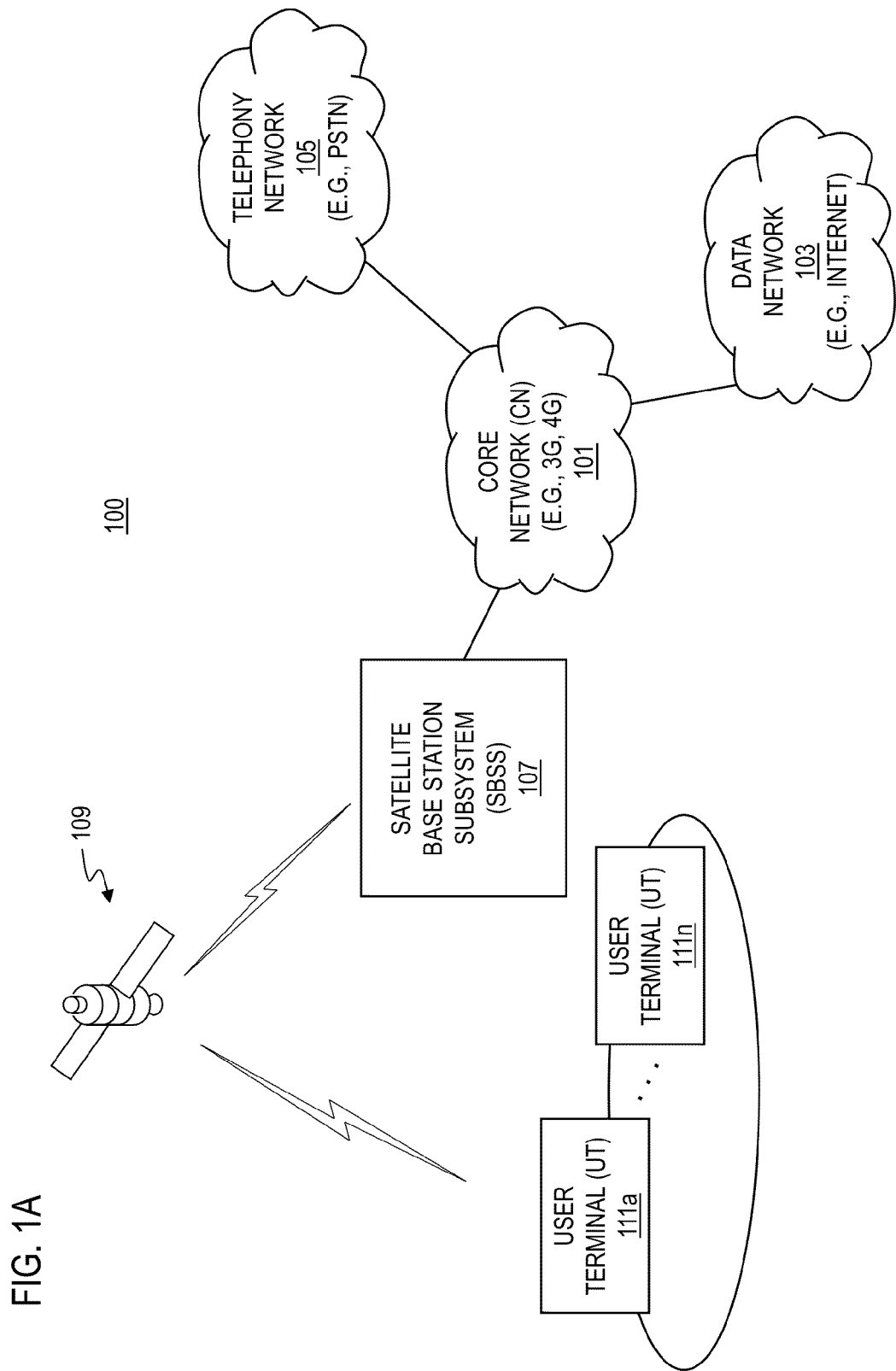
FIGS. 1A and 1B illustrate diagrams of communications systems capable of providing Internet Protocol (IP)-based communications sessions from a terrestrial (wireline or wireless) domain to a satellite domain, according to various exemplary embodiments.
Figure 1B:
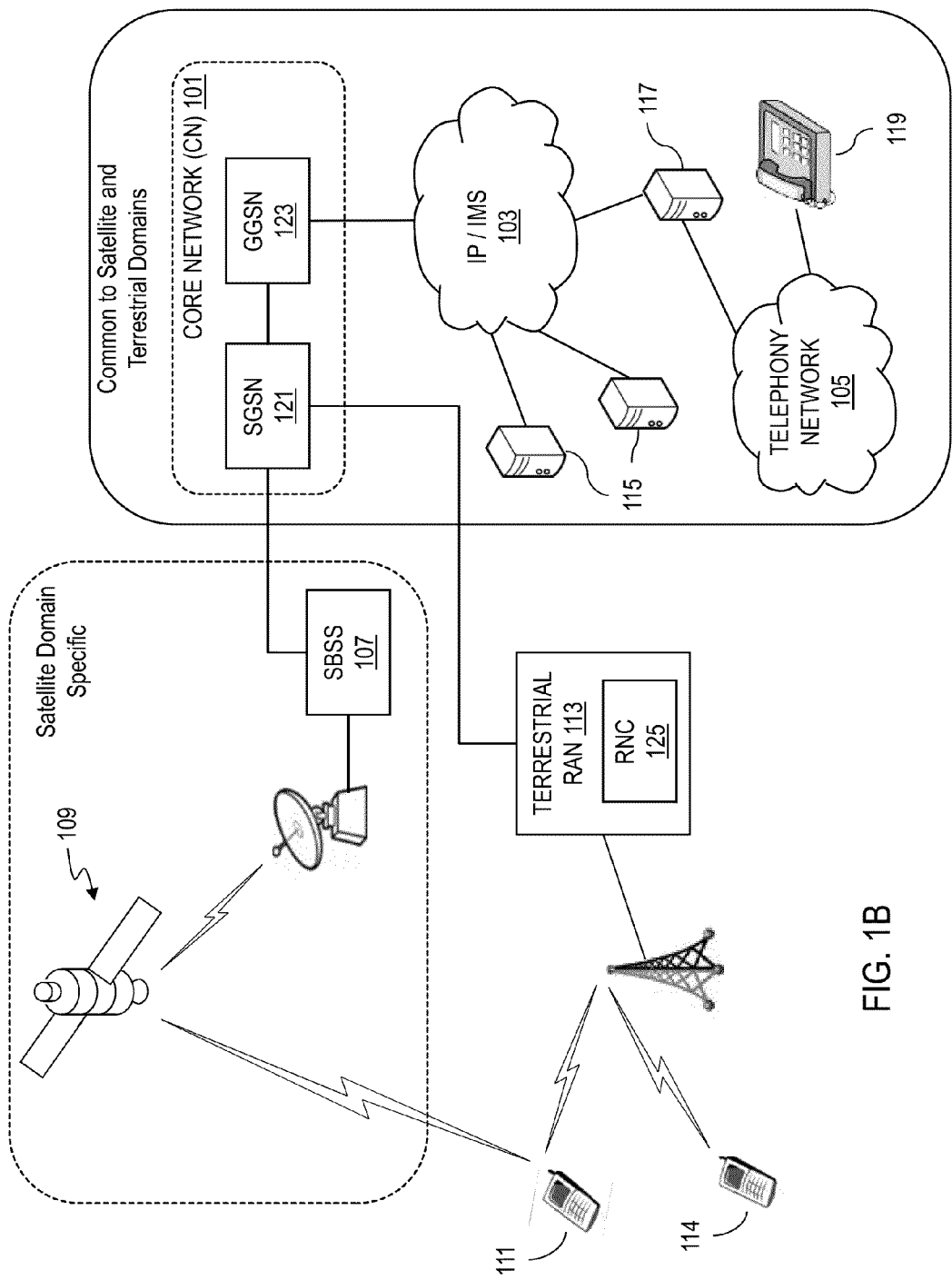

FIGS. 1A and 1B illustrate diagrams of communications systems capable of providing Internet Protocol (IP)-based communications sessions from a terrestrial (wireline or wireless) domain to a satellite domain, according to various exemplary embodiments. For the purposes of illustration, a system 100 of FIG. 1A supports multimedia services using an Internet Protocol (IP) architecture, such that end-to-end communications sessions are packetized. By way of example, a terrestrial core network (CN) 101 is a wireless core network that is compliant with a Third Generation (3G) or Fourth Generation (4G) architecture; e.g., Third Generation Partnership Project (3GPP)-based. For example, the system 100 can utilize a satellite air interface denoted as GMR-1 3G, which is an evolution of the GMR-1 air interface standards; GMR-1 3G has been adopted as a mobile satellite system standard by the European Telecommunications Standards Institute (ETSI) and the International Telecommunications Union (ITU). The wireless core network 101 may also have connectivity to a data network 103 and a telephony network 105.

Networks 101, 103, and 105 may be any suitable wireline and/or wireless network. For example, telephony network 105 may include a circuit-switched network, such as the public switched telephone network (PSTN), an integrated services digital network (ISDN), a private branch exchange (PBX), an automotive telematics network, or other like network. Wireless network 101 (e.g., cellular system) may employ various technologies including, for example, code division multiple access (CDMA), enhanced data rates for global evolution (EDGE), general packet radio service (GPRS), global system for mobile communications (GSM), IP multimedia subsystem (IMS), universal mobile telecommunications system (UMTS), etc., as well as any other suitable wireless medium, e.g., microwave access (WiMAX), wireless fidelity (WiFi), satellite, and the like. Moreover, data network 103 may be any local area network (LAN), metropolitan area network (MAN), wide area network (WAN), the Internet, or any other suitable packet-switched network, such as a commercially owned, proprietary packet-switched network having voice over Internet Protocol (VoIP) capabilities, e.g., a proprietary cable or fiber-optic network.

Within the satellite domain, a satellite base station subsystem (SBSS) 107 is introduced that implements the necessary modifications and enhancements for efficient operation over a satellite 109 to one or more user terminals 111a-111n. These terminals 111a-111n can be of various types with different form factors and transmit capabilities; e.g., sleek hand-held terminals, personal digital assistants (PDAs), vehicular terminals, portable terminals, fixed terminals, automotive telematics terminals, etc.

The SBSS 107 communicates with the wireless network 101, which includes a core network (e.g., 3G/4G) that is unchanged from terrestrial core network. This consequently permits operators to reuse existing 3G/4G core network elements. The interface between the SBSS 107 and the 3G/4G core network 101 can be a standard terrestrial interface. Again, a 3G network interfaces with the 3G/4G CN 101 to transmit IP packets to external networks such as the internet.

The CN 101 includes a Serving GPRS Support Node (SGSN) 121 and a Gateway GPRS Support Node (GGSN) 123. The SGSN 121 is generally operable to transfer data packets to and from UT 111 within its geographical area. Some of the non-limiting functions of SGSN 121 include packet routing and transfer, authentication and charging functions of GPRS mobiles, mobility management and logical link management. A location register of the SGSN 121 stores location information (for example, current cell, current Visitor Location Register) and user profiles of all GPRS users registered with the SGSN 121. The GGSN 123 is responsible for sending user packets to external IP based networks and routing packets back to the mobile user. GGSN 123 is operable to convert GPRS packets coming from SGSN 121 into the appropriate Packet Data Protocol (PDP) format and sends them out to corresponding packet data network. GGSN 123 has several functions, including packet inspection for detecting different types for traffic, which can be used for shaping the traffic under different network load conditions. GGSN 123 keeps a record of active mobile users attached to SGSN 121. GGSN 122 is also responsible for policy control, billing and assigning IP addresses to mobile users. When GGSN 123 receives data addressed to a specific user routed through the CN 101, it checks if the user is active. For example, if UT 111 is active, GGSN 123 forwards the data to SGSN 121, and if UT 111 is not active, the data are discarded.

It is also noted that the architecture of the system 100 permits the same core network element to simultaneously communicate with a terrestrial base station (not shown) and the SBSS 107. This capability is illustrated in FIG. 1B. As seen, the system 100 enables handover procedures between terrestrial base-station and the SBSS 107 to be executed via a core network 101 with standard procedures defined in terrestrial systems. In this example, the UT 111 has the capability to communicate over a satellite link or directly communicate with a terrestrial radio access network (RAN) 113 to the wireless core network (CN) 101. The RAN 113 comprises a radio network controller (RNC) 125, which is responsible for the radio resource management functions and certain mobility management functions of the network. By way of example, the data network 103 is configured as an IP/IMS (IP Multimedia Subsystem) with multiple application servers 115 supplying multimedia content. The data network 103 couples to the PSTN 105 via a media gateway 117; the PSTN 105 can serve one or more voice terminals 119.

The following describes the signal transmission design for the synchronization burst and alert message burst, in accordance with exemplary embodiments of the present invention. The synchronization burst uses a dual chirp waveform methodology, and does not carry any message information. The characteristics of a dual chirp waveform (with respect to the synchronization burst of prior systems) are described in U.S. Pat. No. 6,418,158 (hereinafter referred to as "U.S. Pat. No. 6,418,158"), titled "Synchronization in Mobile Satellite Systems Using Dual-Chirp Waveform," the entirety of which is incorporated by reference herein. The dual chirp waveform is further described in ETSI TS 101 376-5-4. The alert message burst is modulated and FEC encoded. The characteristics of the alert message burst format and channel coding employed in prior systems is described in ETSI TS 101 376-5-2 and ETSI TS 101 376-5-3, respectively. While the synchronization bursts and alert message bursts may be transmitted via different carriers, a synchronization message burst should be transmitted proximal to the respective alert message burst. In accordance with one exemplary embodiment, both the synchronization bursts and alert message bursts are transmitted on the same carrier in a time division multiplexed manner.

Transmission
Synchronization Burst Signal.

In accordance with an exemplary embodiment, the synchronization message burst is transmitted uncoded via a dual-chirp waveform. By way of example, the representation of a synchronization burst transmitted with a dual-chirp waveform, having a frequency sweeping rate of ±7.488 kHz, over a 20 ms interval adopted for the chirp transmission at the transmission rate of 23.4 ksps may be represented as:

$$\cos(\mu\pi(t-0.5NT_s)^2),$$

where $\mu=2\lambda/NT_s^2$, $N=468$, $T_s=(1/23.4)$ms, and $\lambda=0.32$.

Figure 2:
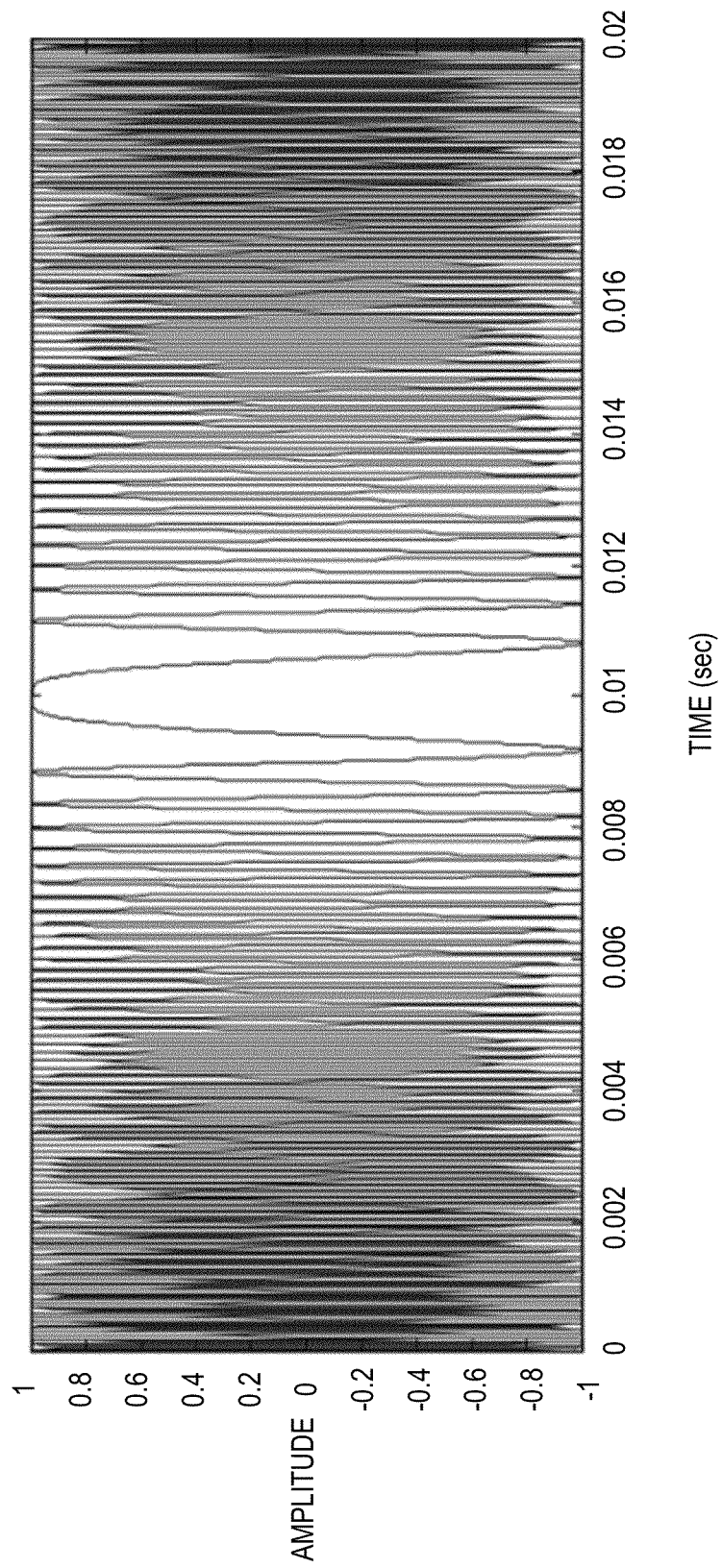
FIG. 2 illustrates an exemplary composite waveform resulting from an exemplary dual-chirp waveform synchronization burst, in accordance with exemplary embodiments.

FIG. 2 illustrates an exemplary composite waveform resulting from an exemplary dual-chirp waveform synchronization burst, in accordance with exemplary embodiments. The composite waveform depicted in FIG. 2 is referred to as a dual-chirp waveform, because it is a composite waveform consisting of two component waveforms: an up-chirp waveform and a down-chirp waveform. A chirp waveform is a signal in which the frequency changes linearly over the duration of the waveform, or, in other words, the frequency sweeps (the frequency varies with time) across the duration of the chirp waveform. Accordingly, a chirp waveform is in contrast to a sinusoidal or tone waveform, in which the frequency remains constant throughout the duration of the waveform. The dual-chirp waveform is a composite of an up-chirp waveform and a down-chirp waveform, where the up-chirp waveform has a frequency that increases linearly with time, and the down-chirp waveform has a frequency that decreases linearly with time. Advantageously, the frequency of the up-chirp waveform and the down-chirp waveform vary oppositely with respect to time, which facilitates detection at the receiver, for example, using a Fast Fourier Transform (FFT).

Alert Message Burst Signal.

An alert message burst may be employed to send an alert message to significantly disadvantaged (e.g., power attenuated) terminals. According to exemplary embodiments, the physical characteristics of an alert message burst include: (1) 36 information bits; (2) FEC outer coding in the form of a Reed-Solomon (15,9) code; (3) rt/2 BPSK modulation; (4) pulse shaping; and (5) transmission as a coded message of 5 alert message bursts. As a result, an alert message block of 36 information bits is transmitted via five alert message bursts.

Figure 3:
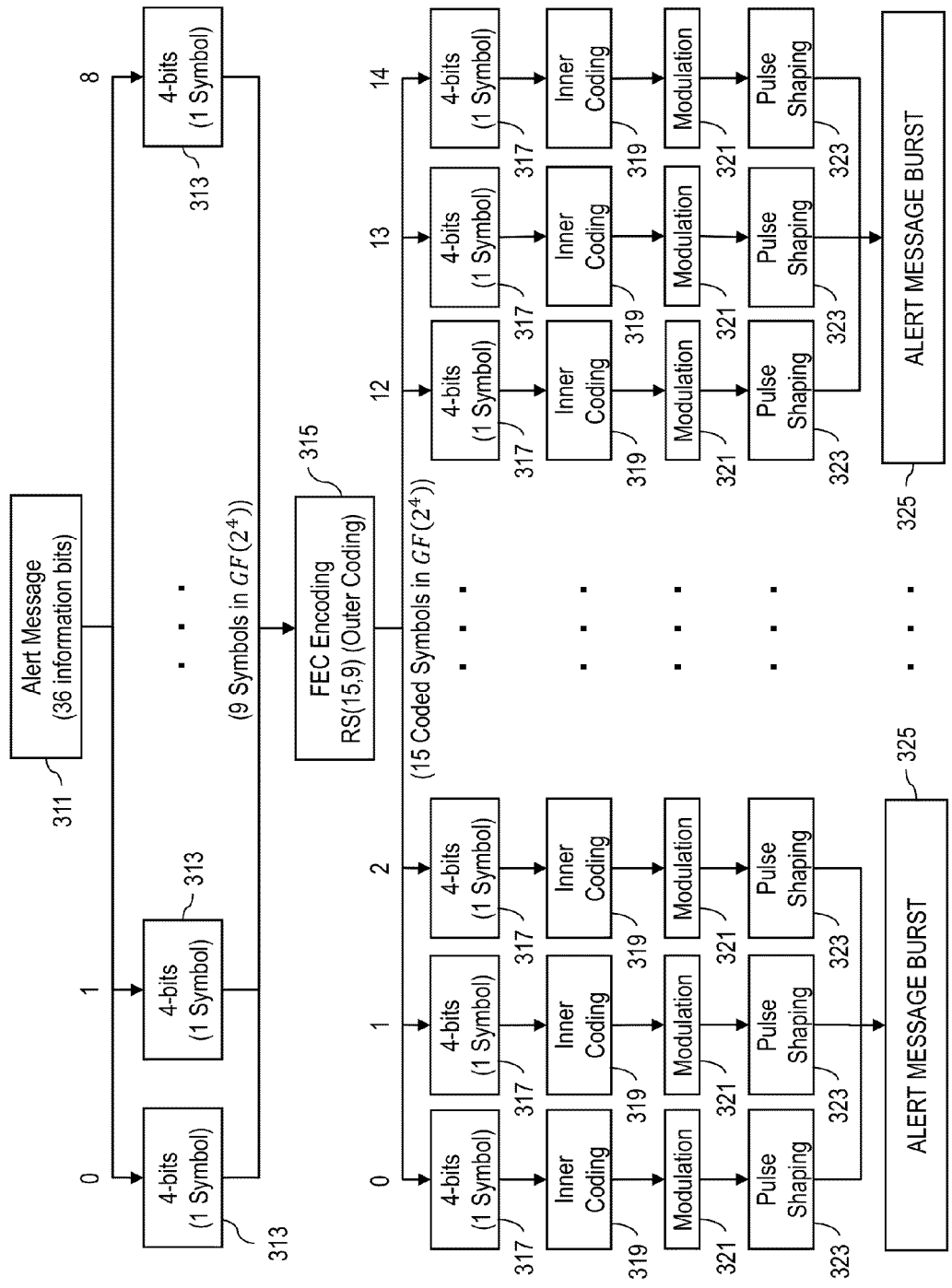
FIG. 3 illustrates FEC coding of an alert message (e.g., of 36 information bits) for transmission as five alert message bursts, in accordance with an exemplary embodiment.

Alert Message:

FIG. 3 illustrates FEC coding of an alert message 311 (e.g., of 36 information bits) for transmission as five alert message bursts 325, in accordance with an exemplary embodiment. Each of the five alert message bursts 325 reflects three coded 4-bit symbols of the alert message 311. By way of example, an alert message block d(k) (of 36 information bits) 311 is first multiplexed into nine 4-bit symbols 313, to produce 9×4 data blocks D, with the elements d(i, j) defined as:

$$d(i,j)=d(k),$$

where $k=0, 1, \ldots 35$; $i=\text{INT}(k/4)$, and $j=k \bmod 4$.

FEC Outer Coding:

The FEC encoding 315 is then applied to each 4-bit symbol in the data block D. By way of example, the FEC encoding comprises a Reed-Solomon (15,9) outer code, with a Galois field of $2^4$ ($GF(2^4)$). The Reed-Solomon encoding adds parity check symbols to produce fifteen 4-bit symbols 317, resulting in a 15×4 data block C with the elements c(i,j). The systematic (15,9) Reed-Solomon (RS) code, generated over the Galois field $GF(2^4)$, is used to encode blocks of 9 information symbols (of 4 bits each) into a block of 15 coded symbols. The Galois field $GF(2^4)$ may be defined with a as its primitive element under an irreducible polynomial:

$$p(X)=1+X+X^4.$$

The generator polynomial G(X) may be defined as:

$$G(X) = g_0 + g_1 X + g_2 X^2 + g_3 X^3 + g_4 X^4 + g_5 X^5 + X^6$$

The (15,9) Reed-Solomon encoder thereby computes and adds six error correction symbols (parity symbols) to the block of 9 information symbols, resulting in the fifteen 4-bit symbols 317, where each alert message burst 325 reflects three Reed-Solomon symbols, and where slotted transmission provides time diversity. Such an FEC outer coding methodology results in a robust coded signal with respect to bursty errors.

Figure 4:
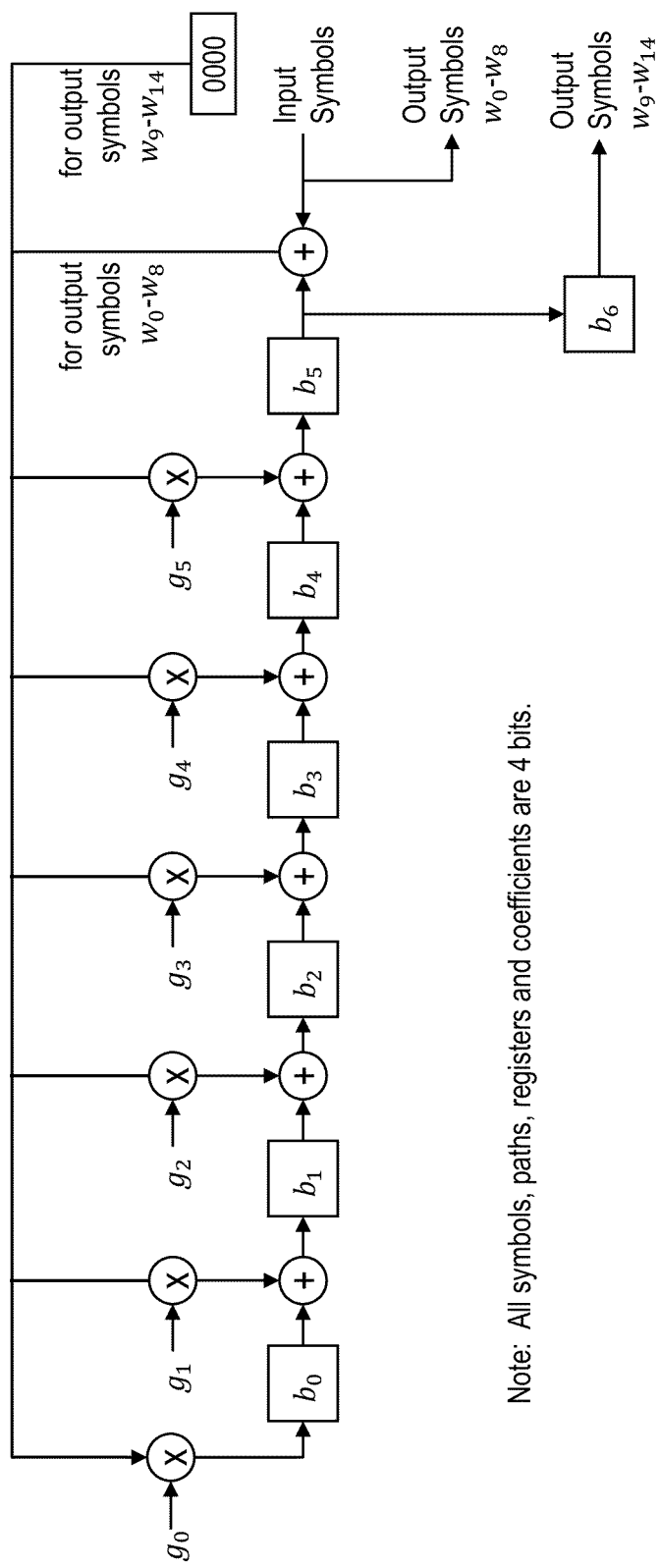
FIG. 4 illustrates an exemplary implementation of an encoding algorithm in the form of a feedback shift register, in accordance with an exemplary embodiment.

FIG. 4 illustrates an exemplary implementation of an encoding algorithm in the form of a feedback shift register, in accordance with an exemplary embodiment. The register ($b_0$-$b_6$) is initially loaded with zeros. When the input message symbols ($w_0$-$w_8$) arrive, they are delivered to the output symbols ($w_0$-$w_8$) and simultaneously added to $b_5$, to serve as the common feedback symbols. At each tap, the feedback symbol is multiplied by the respective tap coefficient ($g_0$-$g_5$). The product is then available at each tap for the shift operation, where the shift begins at the output end, using the previous register values. Specifically, symbol $b_5$ is shifted to $b_6$, and $b_4$ is added to the feedback result and stored in $b_5$. This process continues until finally $b_0$ is loaded with its new value. For the output symbols ($w_9$-$w_{14}$), a zero is asserted as the feedback symbols, and the register contents are shifted to the output. The shift occurs before the output is taken. As an alternate implementation, the register could be read out in order ($b_5$-$b_0$) for the ($w_9$-$w_{14}$) symbol outputs.

Each 4-bit RS coded symbol 317 is then coded based on an inner coding 319. By way of example, a 16-ary orthogonal sequence inner coding is applied based on binary orthogonal sequences, as follows:

| Sequence | Sequence Elements (76 per each Sequence) |
|---|---|
| S0 | 0001001100001111001100000000111111001111111100111111000000001100111100001100 |
| S1 | 0011000100110000111100110000000011111100111111110011111110000000100111110000 |
| S2 | 0000001100010011000011110011000000000111111001111111100111111000000000110011111 |
| S3 | 0011110000110001001100001111001100000000111111001111111100111111000000001100 |
| S4 | 0011001111000011000100110000111100110000000011111100111111110011111100000000 |
| S5 | 0000001100111100001100010011000011110011000000001111110011111111001111110000 |
| S6 | 0000000000110011110000110001001100001111001100000000111111001111111100111111 |
| S7 | 0011110000000011001111000011000100110000111100110000000011111100111111110011 |
| S8 | 1110000001111111001100001110011101100111100000100111111110000001100000000 |
| S9 | 1100001100000011111111001000011110011010010011100000110011111110000000110000 |
| S10 | 1100000001100000011111110010000111100110110011001110000100111111110000011 |
| S11 | 1100110000000110000011111110010000111100110100111100001001111111110000 |
| S12 | 1100000011000000001000000111111100110000111100110110011111000001100111111 |
| S13 | 1111110000001100000001100000011111110011001100011110011101100111100000110011111 |
| S14 | 1111111110000001100000000110000011111111001100011100011101100111110000110011 |
| S15 | 1111001111111000000110000000110000000111111110011000011110011011001111110000 |

Further, each of the 4 RS coded bits 317 (i.e., one RS symbol) is mapped to a respective one of the 16 sequences $S_j$, as follows:

| Coded Bits {c(i, 0), . . . c(i, 3)} | Sequence $S_j$ |
|---|---|
| 0000 | $S_0$ |
| 0001 | $S_1$ |
| 0010 | $S_2$ |
| 0011 | $S_3$ |
| 0100 | $S_4$ |
| 0101 | $S_5$ |
| 0110 | $S_6$ |
| 0111 | $S_7$ |
| 1000 | $S_8$ |
| 1001 | $S_9$ |
| 1010 | $S_{10}$ |
| 1011 | $S_{11}$ |
| 1100 | $S_{12}$ |
| 1101 | $S_{13}$ |
| 1110 | $S_{14}$ |
| 1111 | $S_{15}$ |

The three concatenated sequences of each alert message burst are then scrambled by a binary scrambling sequence of length 228, as follows:

00010011000110111100010000100101000011111100011
0000010101111101111
11001101011010101110110010011001011011111000100
01101101000011111011
01100000101001001000000011000111000000001000010
1111111100000110101
01011111101100110010101001000100110

For example, the first scrambling bit is scrambled with the first bit of first orthogonal sequence in the burst, and the last scrambling bit is scrambled with the last bit of the third orthogonal sequence in the burst. A bit for one idle symbol at the end of each burst is set to 0 with no scrambling.

Modulation:

The scrambled sequences are then modulated 321. By way of example, a π/2 BPSK modulation scheme is employed, as follows:

$$S_l = (-1)^{d_l} e^{jl(\pi/2)}$$

where $d_l$ denotes the scrambled bits, and $S_l$ denotes the π/2 BPSK modulated symbol.

Pulse Shaping:

The complex valued modulated symbols are filtered, for example via a pulse shaping filter 323, prior to transmission. By way of example, a square root raised cosine filter with roll off factor 0.35 is applied for pulse shaping, as follows:

$$h(t) = \frac{T_s^2/4\alpha}{\pi((T_s/4\alpha)^2 - t^2)} \left\{ \cos\left(\frac{(1+\alpha)\pi t}{T_s}\right) + \frac{T_s}{4\alpha t}\sin\left(\frac{(1-\alpha)\pi t}{T_s}\right) \right\}$$

where α=0.35 is the roll-off factor of the pulse shaping filter, and
$T_s$=1/23,400 is the symbol duration in seconds.

The burst can be represented by:

$$x(t) = g(t) \left\{ \sum_{k=0}^{N-1} s_k h(t - T_s) \right\}$$

where N=234 is the number of symbols in the burst, and g(t) is the time window function that controls the burst ramping up and down.

Figure 5:
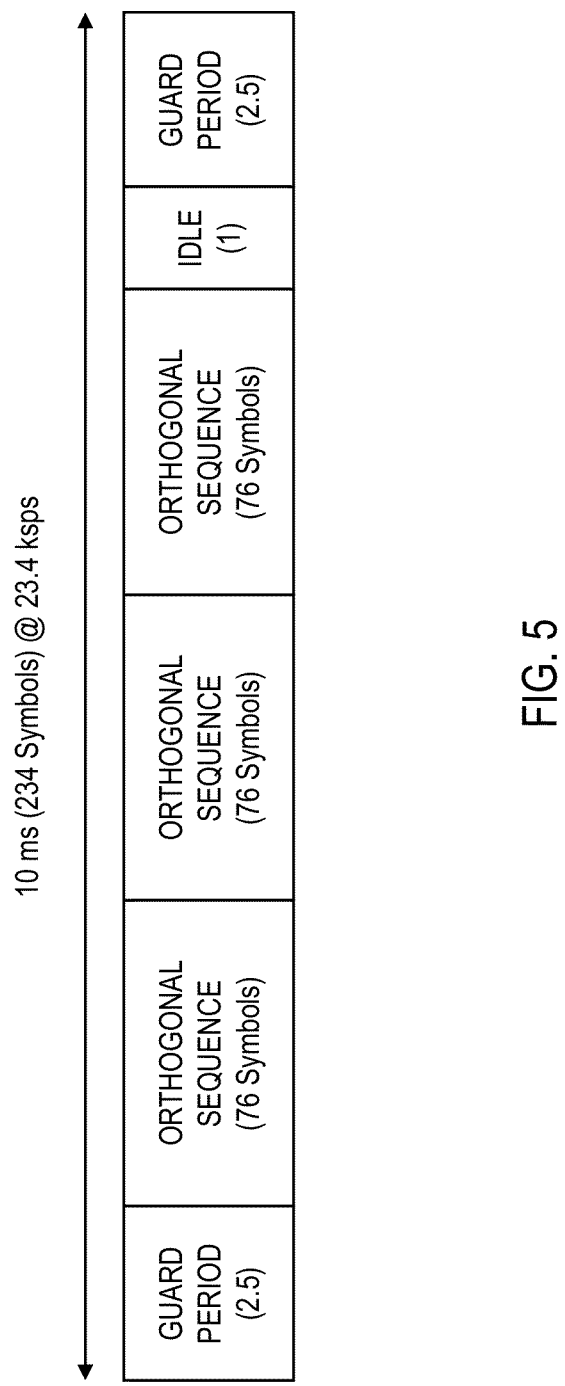
FIG. 5 illustrates an exemplary alert message burst, reflecting three modulated orthogonal sequences, of a time duration of 10 ms at the transmission rate of 23.4 ksps, in accordance with an exemplary embodiment.

For example, each alert message burst, reflecting three π/2 BPSK modulated scrambled orthogonal sequences, may be of a time duration of 10 ms at the transmission rate of 23.4 ksps, as depicted in FIG. 5.

Multiplexing of Synchronization Burst and Alert Message Burst.

In accordance with an exemplary embodiment, the Synchronization Bursts and Alert Message Bursts are transmitted according to a time distributed transmission over the same carrier. By way of example, the synchronization burst is periodically transmitted (e.g., the network may transmit a synchronization burst of a 20 ms duration every 320 ms). Additionally, a single alert message is transmitted over a number of alert message bursts (e.g., alert message 311 transmitted over the five alert message bursts 325, as illustrated in FIG. 3), where each burst, for example, is of a duration of 10 ms. Further, to achieve further efficiencies, multiple UTs 111 (e.g., mobile terminals) can be alerted via a single carrier using multiple alert groups (Alert Groups or AGs) of alert message bursts. A mobile terminal thus need only monitor a particular AG to which it is assigned. Accordingly, various benefits are realized by such multiplexing of synchronization and alert messages. For example, once synchronized, a mobile terminal need only monitor the pre-assigned time slots for the respective alert group assigned to the terminal, which conserves mobile terminal battery life, and time diversity gain in the presence of multi-path fading reduces fading margin requirements.

Figure 6:
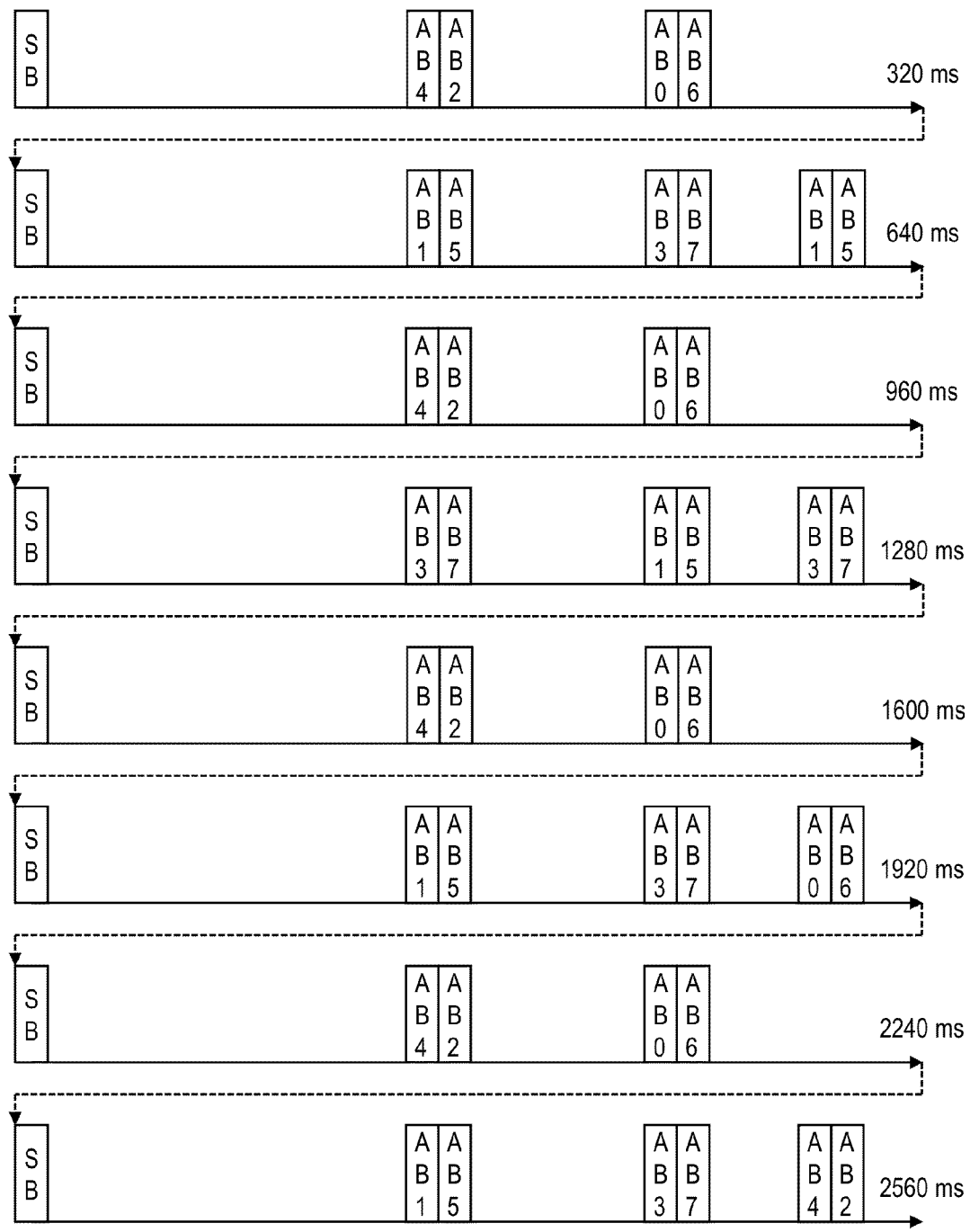
FIG. 6 illustrates a time distributed signal transmission of the Synchronization Burst and Alert Message Bursts, in accordance with an exemplary embodiment.

FIG. 6 illustrates a time distributed signal transmission of the Synchronization Burst and Alert Message Bursts, in accordance with an exemplary embodiment. As illustrated in FIG. 6, alert messages are transmitted to a batch group of eight different alert groups {AG0, AG1, ... AG6, AG7} over a period of 2560 ms (2.56 seconds), where each alert group transmission (AG(x)) comprises the five alert message bursts of the respective alert message. A particular UT 111 will look at the alert message of the five alert message bursts transmitted at the time slot of the respective alert group to which that terminal is assigned. Further, a synchronization burst (SB) is transmitted at the beginning of each 320 ms interval, and each UT will monitor (wake up for) every SB. Within this 2.56 second time period, each UT will know within which 320 ms SB periods to look for the alert message bursts associated with the alert group assigned to the UT, and will know the time slot within those particular 320 ms SB periods to acquire the respective alert message bursts.

More specifically, prior to entering the alerting mode, a UT will have completed a system-level synchronization. During the system level synchronization, the UT receives certain system information via a system information broadcast, including acquisition of system-level frame and frame number synchronization (and slot synchronization within the frames). Further, the system information provides the UT with the location of the synchronization bursts and the respective alert group locations (in the time domain) as a function of the frame and slot number. Based on the frame synchronization, the UT maintains an internal clock, and thereby knows when to wake up for each synchronization burst, and (with respect to each SB) where the particular alert burst locations are within each 320 ms SB period. Accordingly, the synchronization bursts enable the UT to maintain timing and frequency synchronization, and enable the UT to locate the alert group transmissions assigned to it, in relation to the respective synchronization bursts.

Reception

The UT 111 (e.g., mobile terminal) acquires time and frequency synchronization with the incoming transmissions from the network. Once time and frequency synchronized, the mobile terminal can demodulate the alert message bursts and decode and reassemble the alert message. The characteristics of the synchronization burst acquisition and tracking process, as employed in prior systems, is described in U.S. Pat. No. 6,418,158. The following describes the synchronization burst acquisition and tracking process of exemplary embodiments of the present invention.

FIG. 7 illustrates a block diagram of a demodulator and decoder of a UT or mobile terminal receiver, in accordance with an exemplary embodiment. The demodulator demodulates the synchronization bursts and alert message bursts received by the terminal. As depicted in FIG. 7, the demodulator comprises an SQRC matched filter 711, a sample interpolator and decimation module 713, a frequency and timing estimation and tracking module 715, a timing and frequency compensation module 717, a π/2 de-rotation and descrambling module 719, a joint sequence detection module 721 and associated orthogonal sequence module 723, an SNR estimation and decoder input generation module 725, and a buffer module 727.

As will be appreciated, a module or component (as referred to herein) may be composed of software component(s), which are stored in a memory or other computer-readable storage medium, and executed by one or more processors or CPUs of the respective devices. As will also be appreciated, however, a module may alternatively be composed of hardware component(s) or firmware component(s), or a combination of hardware, firmware and/or software components. Further, with respect to the various exemplary embodiments described herein, while certain of the functions are described as being performed by certain components or modules (or combinations thereof), such descriptions are provided as examples and are thus not intended to be limiting. Accordingly, any such functions may be envisioned as being performed by other components or modules (or combinations thereof), without departing from the spirit and general scope of the present invention.

Synchronization Burst Acquisition.

During acquisition at the UT 111, an acquisition system within the terminal searches a pre-defined set of carriers (e.g., searches 10 channels of approximately 1000 available channels) for the synchronization burst (e.g., the dual-chirp waveform, as described above). Once located, the UT utilizes the dual-chirp waveform (e.g., as depicted in FIG. 2) to determine the associated frequency offset and timing offset, which is used to compute the carrier frequency and frame timing information (e.g., for communications to the gateway or SBSS 107 via the satellite 109). The UT thereby has completed acquisition of the synchronization burst, and is thus synchronized with the gateway or SBSS 107.

FIG. 8 illustrates an exemplary process whereby the mobile terminal or UT receiver acquires initial timing and frequency based on the synchronization burst, in accordance with an exemplary embodiment. By way of example, the receiver acquisition process uses a total search window of 340 ms, which equates to the synchronization burst transmission period (e.g., 320 ms) plus the synchronization burst duration (e.g., 20 ms). The burst acquisition is performed based on a sliding window buffer of 20 ms, with a 2.5 ms shift, which results in a total of 129 overlapped buffers in the 340 ms search window.

For each 20 ms buffer window, the following describes the synchronization burst acquisition and tracking process, as depicted in FIG. 8. First, a 20 ms matched filter output is captured (4 samples/symbol), corresponding to 4*4*117=1872 complex samples. The I and Q signals are then decimated by a factor of two, resulting in 2*4*117=936 complex samples. A desweeping with respect to the up-chirp, for the 936 complex samples, as follows: $\exp(-\mu\pi(t-0.5NT_s)^2)$. Then eighty-eight complex zeros are added to the 936 complex samples to make 1024 complex samples for Fast Fourier Transform (FFT) processing. Based on the FFT output, signal-to-noise ratio (SNR) and frequency estimation are performed, and the SNR and up-chirp frequency estimation (f_est_up) are recorded for each buffer window. More specifically, the SNR and frequency estimation comprise the following steps:

1. Find the frequency bin that gives the maximum $|FFT|^2$ and denote it as f_est_up.
2. Perform signal power computation, as follows:

$Ps=(|FFT(f\_est\_up)|^2+|FFT(f\_est\_up\_left)|^2+|FFT(f\_est\_up\_right)|^2)/3$ where f_est_up_left and f_est_up_right are the closest neighbor bins left and right of f_est_up, respectively.
3. Perform noise power computation, as follows:

$Pn=$(sum of $|FFT|^2$ for the other 1024 bins)/(1024)

4. Compute the SNR as SNR=10 log(Ps/Pn).

If the estimated SNR is larger than a predefined detection threshold (e.g., 10 dB) for a predefined maximum consecutive buffers (e.g., max_consecutive=4 continuous buffers), then detection of the burst is set. This process is repeated until the end of the 340 ms search window, and the estimated SNR and its corresponding f_est_up are updated with the highest SNR during the 340 ms search. Then, for the buffer detected with the highest SNR, a desweeping is performed with respect to the down-chirp, for the 936 complex samples, as follows: $\exp(-\mu\pi(t-0.5NT_s)^2)$. Again, eighty-eight complex zeros are added to the 936 complex samples to make 1024 complex samples for Fast Fourier Transform (FFT) processing. Based on the FFT output, signal-to-noise ratio (SNR) and frequency estimation are performed, and the SNR and down-chirp frequency estimation (f_est_up) are recorded for each buffer window. More specifically, the SNR and frequency estimation comprise the following steps:

1. Find the frequency bin that gives the maximum $|FFT|^2$ and denote it as f_est_down.
2. Perform signal power computation, as follows:

$Ps=(|FFT(f\_est\_down)|^2+|FFT(f\_est\_down\_left)|^2+|FFT(f\_est\_down\_right)|^2)/3$ where f_est_down_left and f_est_down_right are the closest neighbor bins left and right of f_est_down, respectively.
3. Perform noise power computation, as follows:

$Pn=$(sum of $|FFT|^2$ for the other 1024 bins)/(1024)

4. Compute the SNR as SNR=10 log(Ps/Pn).

If the estimated SNR with respect to the down-chirp is also larger than the predefined detection threshold (e.g., 10 dB), the synchronization burst is determined as being present in the respective buffer, and the freq_est_down is recorded (which gives the maximum). Otherwise, it is determined that no burst has been detected in the 340 ms search window. This situation may arise, for example, when the presence of noise and/or other interference prevents the receiver from detecting the synchronization burst in a particular 320 ms synchronization burst period. Once the synchronization burst is detected, the frequency and timing shifts are computed, as follows:

freq_offset_est=(freq_est_up+freq_est_down)/2.0 time_offset_est=(freq_offset_est−freq_est_up)/μ.

In accordance with a further exemplary embodiment, a three-point Lagrange interpolator may be used to enhance the frequency estimation.

Synchronization Burst Tracking.

The following describes the time and frequency tracking algorithm, for a dual chirp synchronization burst waveform, in accordance with an exemplary embodiment. By way of example, the following table summarizes the receiver parameters for synchronization tracking:

| Module | Parameter Values |
| --- | --- |
| SQRC Matched Filtering (Module 711) | Number of symbols per burst: N = 468<br>Roll-off factor: α = 0.35; Filter window size: L = 8 symbols<br>Number of samples per symbol: M = 4 |
| Timing Error Compensation Interpolation and Decimation (Module 713) | Number of samples per symbol: M = 4 before interpolation<br>Interpolation filter tap length: I = 16<br>Oversampling factor for interpolation: v = 8 |
| Frequency Error Compensation and De-Chirping (Module 717) | Number of samples per symbol: M = 2<br>De-chirping applies to both up-chirp and down-chirp<br>Frequency correction from tracking loop is also applied during de-chirping |
| Frequency and Timing Error Estimation (Module 715) | Number of samples per symbol: M = 2<br>1024 point FFT for both up and down chirps<br>Consider only adjacent ±2 FFT bins from the tracking frequency (total 5 hypothesis testing) for maximum correlation peak search.<br>Frequency and timing error signals are generated by adding and subtracting up and down chirp FFT frequency estimate, respectively. |
| Frequency and Timing Tracking Loop (Module 715) | $2^{nd}$ order tracking loop for timing and frequency individually |

According to an exemplary embodiments of the present invention, the frequency and timing offset error generation follows the equations described above, namely: freq_offset_est=(freq_est_up+freq_est_down)/2.0, and time_offset_est=__ __ (freq_offset_est−freq_est_up)/μ. However, based on various advantages or improvements achieved via such exemplary embodiments, a majority of frequency and timing uncertainly is removed during the initial synchronization acquisition process, and thus the frequency and timing uncertainty in the synchronization tracking mode is greatly reduced from that of the initial acquisition phase. Hence, according to a further exemplary embodiment, the number of FFT bins used for the correlation peak search can be reduced from 1024 bins to 5 bins centered around the tracked frequency. This reduction in the number of FFT bins used for the correlation peak search results in a minimization of the receiver detecting wrong FFT frequency bins, and improves frequency and timing tracking performance. Further, the reduction in the number of FFT bins also results in a reduction of computation complexity and time for the synchronization tracking process.

Figure 9A:
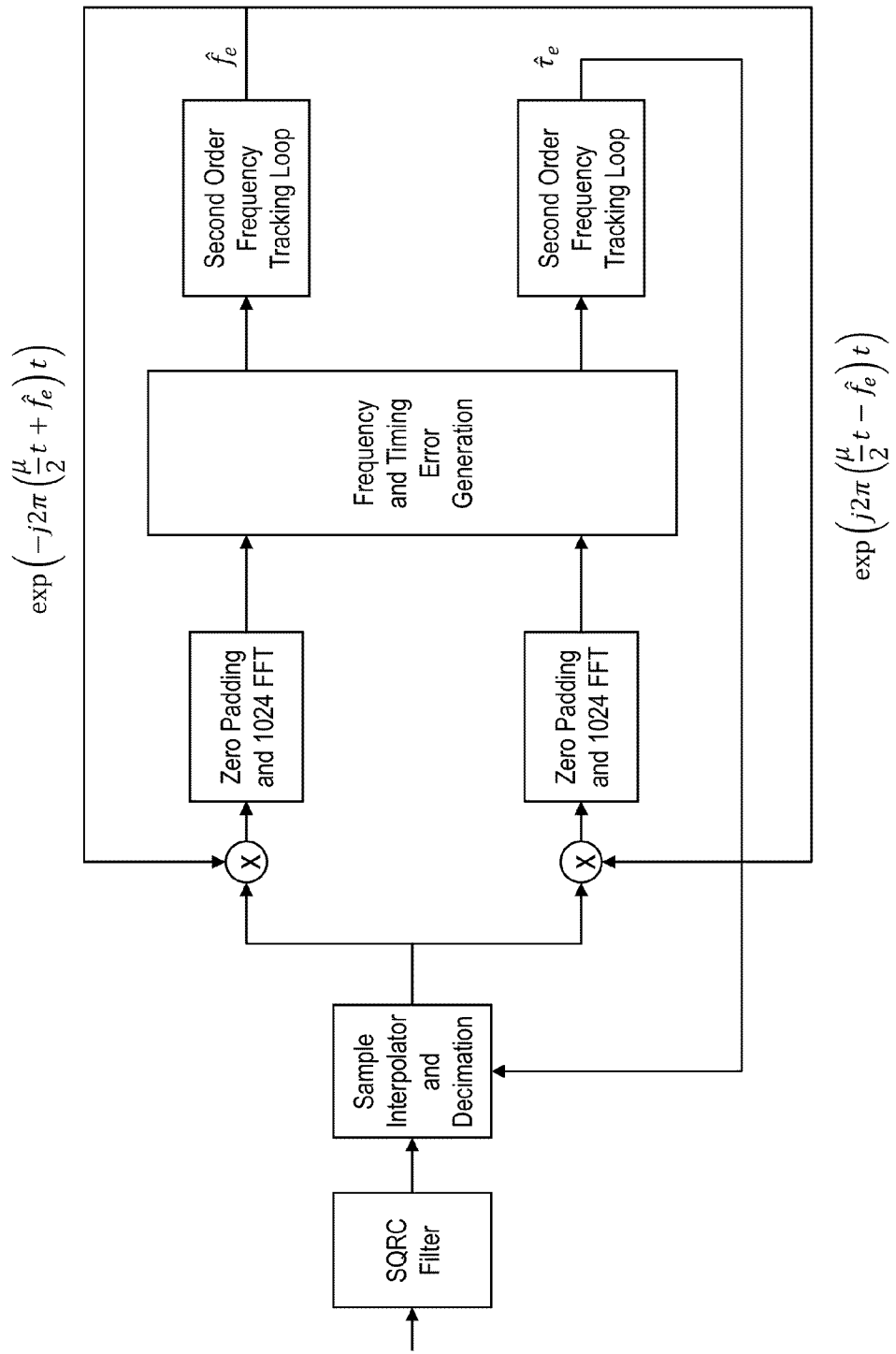
FIG. 9A illustrates a synchronization burst tracking algorithm, in accordance with an exemplary embodiment.
Figure 9B:
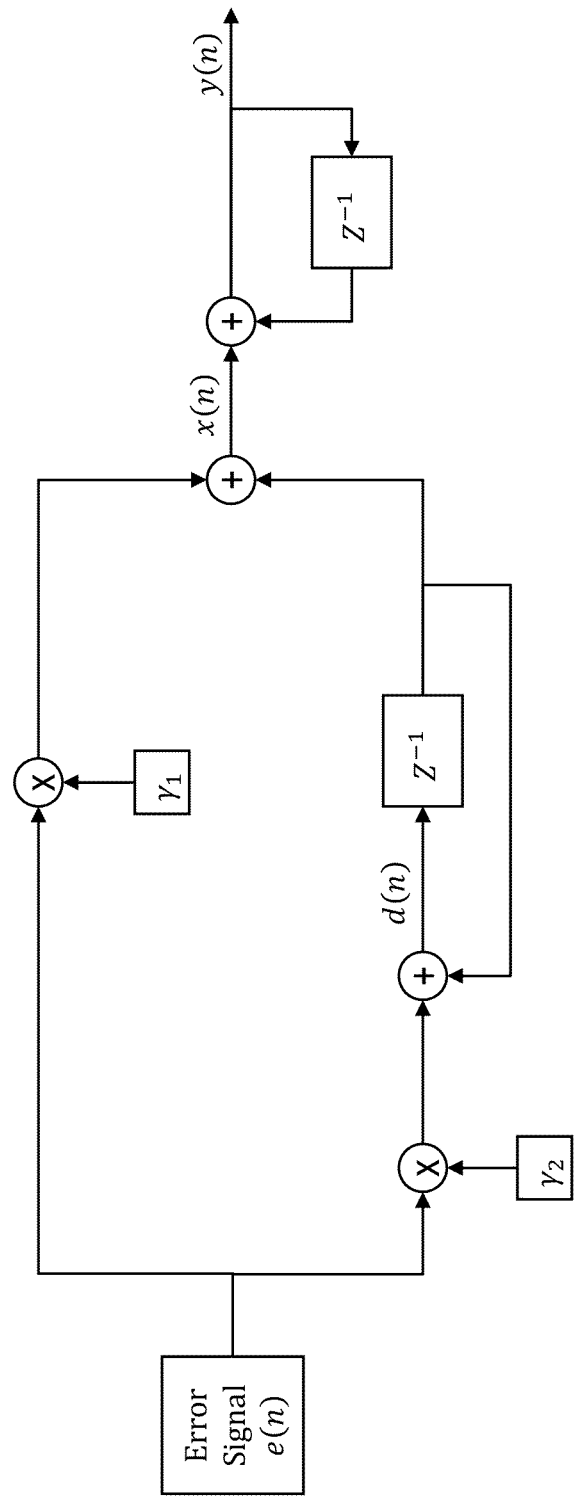
FIG. 9B illustrates a 2nd order loop that can be used to track the frequency and timing individually, in accordance with an exemplary embodiment.

FIG. 9A illustrates a synchronization burst tracking algorithm, in accordance with an exemplary embodiment, and FIG. 9B illustrates a 2nd order loop that can be used to track the frequency and timing individually, in accordance with an exemplary embodiment. By way of example, the equivalent equations for the loop filter of FIG. 9B may be reflected as:

$$x(n)=d(n-1)+\gamma_1 e(n)$$

$$d(n)=d(n-1)+\gamma_2 e(n)$$

$$y(n)=y(n-1)+x(n)$$

The coefficient $\gamma_1$ is the first order parameter, which defines the length of the averaging window, and is thus directly related to the bandwidth of the loop. The coefficient $\gamma_2$ is the second order parameter, which acts like a gain on the stochastic estimate of the drift. The determination of the $\gamma_1$ and $\gamma_2$ values sets a tradeoff between drift tracking and averaging, and are performed using simulation. Further, the following table reflects exemplary frequency and timing tracking filter coefficients:

|  | $\gamma_1$ | $\gamma_2$ |
| --- | --- | --- |
| Frequency Tracking Filter | 0.55 | 0.000250 |
| Timing Tracking Filter | 0.05 | 0.002 |

Demodulation.

As mentioned above, the demodulator of the UT 111 (e.g., the demodulator illustrated in FIG. 7) demodulates the alert message burst signals (as well as the synchronization burst signals) received by the terminal. As would be well recognized and understood by one of skill in the art, the receipt, demodulation of the alert message burst comprises: (1) SQRC matched filtering (module 711); (2) timing and frequency compensation using the synchronization tracking loop outputs (modules 713, 715, 717); (3) π/2 de-rotation and descrambling (module 719); (4) orthogonal sequence detection, jointly correlating all three sequences received in the burst (modules 721, 723); (5) SNR estimation and decoder input word generation, with one per Reed-Solomon symbol and three total (module 725); and (6) buffering of three 4-bit words for every received alert message burst (module 727). By way of example, the following table summarizes the receiver parameters for alert message burst demodulation and decoding:

| Module | Parameter Values |
| --- | --- |
| SQRC Matched Filtering (Module 711) | Number of symbols in a burst: N = 234<br>Roll-off factor: α = 0.35, Filter window size: L = 8 symbols<br>Number of samples per symbol: M = 4 |
| Timing Estimation (Module 715) | From Synchronization Burst tracking |
| Interpolation and Decimation (Module 713) | Synchronization Interpolator<br>Interpolation filter tap length: I = 16<br>Oversampling factor for interpolation: v = 8 |
| Frequency Estimation and Compensation (Modules 715, 717) | From Synchronization Burst tracking<br>Number of samples per symbol: M = 1 |
| Orthogonal Joint Sequence Detection (Module 721) | Correlation is performed jointly across three received sequences. To minimize processing complexity, the joint detection can be limited to total 5 candidates for each received sequence segment, reducing the total number of hypothesis from 16 × 16 × 16 to 5 × 5 × 5 in the burst. The five candidates for each received sequence are determined by top five maximum correlation magnitudes when the correlation is individually performed on single sequence duration. |
| RS Symbol SNR Estimation (Module 725) | SNR estimation is performed for each RS symbol, total three SNR estimates per burst. Number of symbols used in each SNR computation: 76 |
| Soft Decision (Module 725) | 4 coded bits per RS symbol<br>Three 4 decoded bits per burst |

More specifically, for example, the three 16-ary sequences in the alert message burst may be jointly determined in the following manner:

$$\{l_1, l_2, l_3\} = \underset{0 \le \{j_1, j_2, j_3\} \le 15}{\operatorname{argmax}} \left[ |S_{j_1}^{(1)} + S_{j_2}^{(2)} + S_{j_3}^{(3)}|^2 \right]$$

where $S_j^{(k)}$ denotes a complex value obtained by correlating the k-th received sequence in the burst with the stored 16-ary sequence with index l. Notice that the above optimum joint detection demands significant processing compared to each sequence is detected individually. To minimize processing complexity, the size of each index in $\{j_1, j_2, j_3\}$ is limited to total 5 sequence indexes that give the top 5 maximum correlation magnitudes when the correlation is individually performed on single sequence duration.

Decoding.

A Reed-Solomon (RS) decoder, for example, can be used to correct all combinations of v symbol errors and e symbol erasures, provided that the following inequality holds true: v+e/2≤t, where t is the error correction capability of the RS code. For example, for a (15,9) RS code, t=3. All 15 words are used to compute the various intermediate computations so that the input stream must be completely read in to begin the processing. By way of example, an iterative erasure-based decoding algorithm (e.g., generalized minimum distance (GMD) decoding) may be used for decoding, where the data is processed in 4-bit words with arithmetic operations performed in Galois field $2^4$ (GF($2^4$)). GMD decoding provides an efficient algorithm for decoding based on using an errors and erasures decoder for the outer code, where a confidence for each received codeword is determined and symbols exhibiting a confidence below a predetermined value are erased.

Figure 10A:
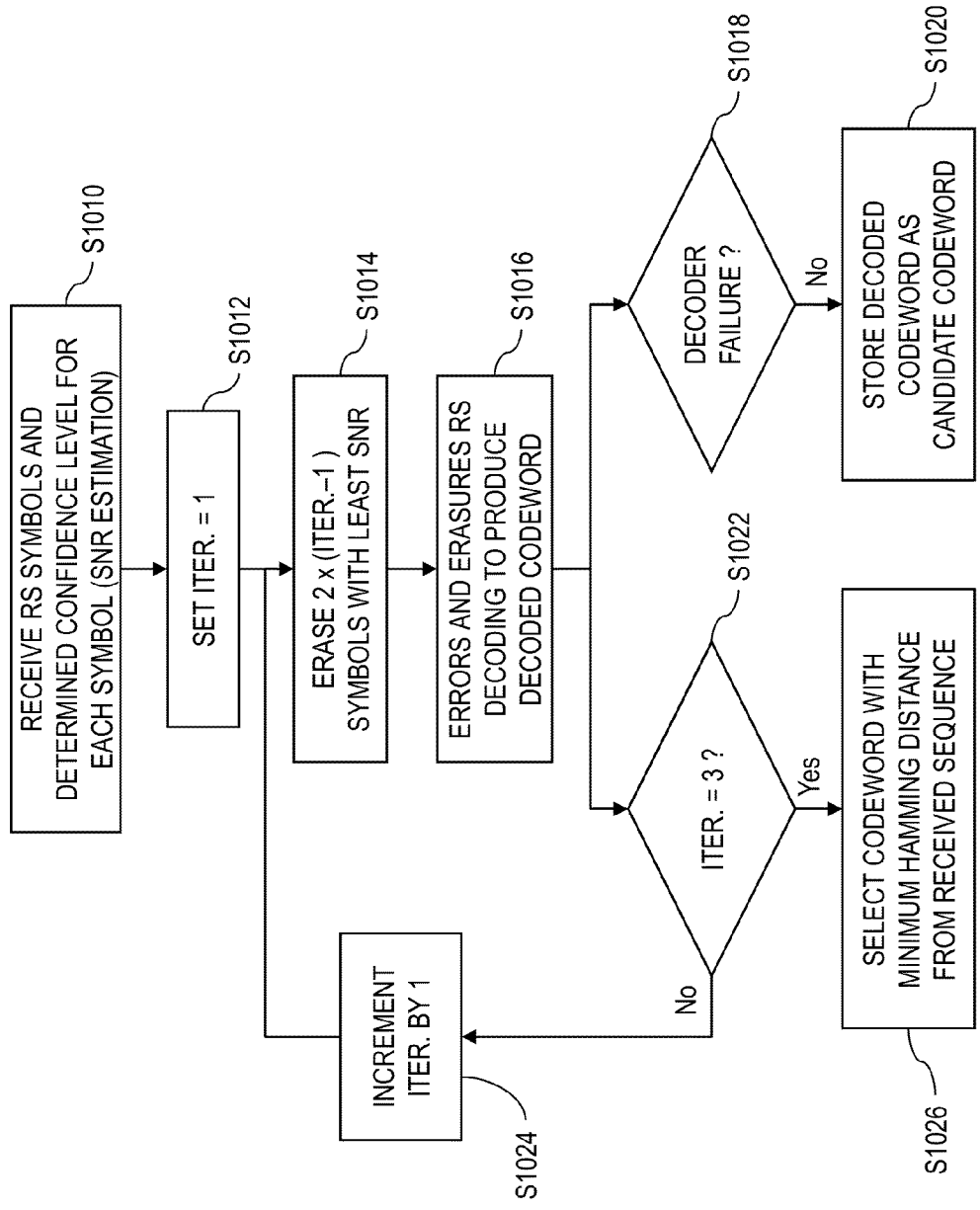
FIG. 10A illustrates a flow chart depicting an iterative erasure-based decoding process, in accordance with an exemplary embodiment.

Iterative Erasure-Based Decoding:

FIG. 10A illustrates a flow chart depicting an iterative erasure-based decoding process, in accordance with an exemplary embodiment. By way of example, with an iterative erasure-based decoding, more than one codeword is produced by iteratively running the RS decoder using 0, 2, . . . etc. erasures, and the algorithm then selects the most likely codeword from an available set of determined candidate codewords. With reference to FIG. 10A, the Reed-Solomon encoded symbols are first received, and the SNR estimation per burst is used as a reliability or confidence measure to determine the RS symbols to be erased at each iteration (S1010). The iteration (ITER.) is set to 1 for the 1$^{st}$ iteration (S1012). Next, a number of symbols with the lowest confidence (lowest SNR) are erased, where the number to be erased is two times the iteration number minus one (2* (ITER.−1)) (S1014). For example, for the first iteration, zero RS symbols are erased (2*(1−1)=0). Accordingly, the RS symbols exhibiting the lowest SNR are the first to be erased pursuant to the algorithm. For the present iteration, a Euclidian decoding algorithm for errors and erasures is then employed to produce a decoded codeword (S1016). Then, if no decoder failures occurred (S1018), the decoded codeword is stored as a candidate codeword (S1020). Also, if the iteration is less than 3 (S1022), then the iteration is incremented by one (S1024), and the process returns to S1014. Alternatively, if the iteration equals 3 (S1022), then the codeword with the minimum Hamming distance from the received sequence is selected (S1026).

As specified above, the (15,9) Reed-Solomon decoder can correct all combinations of v symbol errors and e symbol erasures, provided that the following inequality v+e/2≤t holds true. The following table lists the number of symbols to be erased by iteration number:

| Iteration | e Symbol Erasures | v Symbol Errors | Comments |
|---|---|---|---|
| 1 | 0 | 3 | Error Correction Only/No erasure |
| 2 | 2 | 2 | |
| 3 | 4 | 1 | Max iteration |
| 4 | 6 | 0 | Not used |

Accordingly, because the decoding algorithm includes a maximum of 3 iterations, the resulting decoded codeword candidate list can have no more than three decoded codewords. The codeword that reflects the lowest Hamming distance with respect to the hard decision received sequence is chosen as the decoded solution (S1026).

Figure 10B:
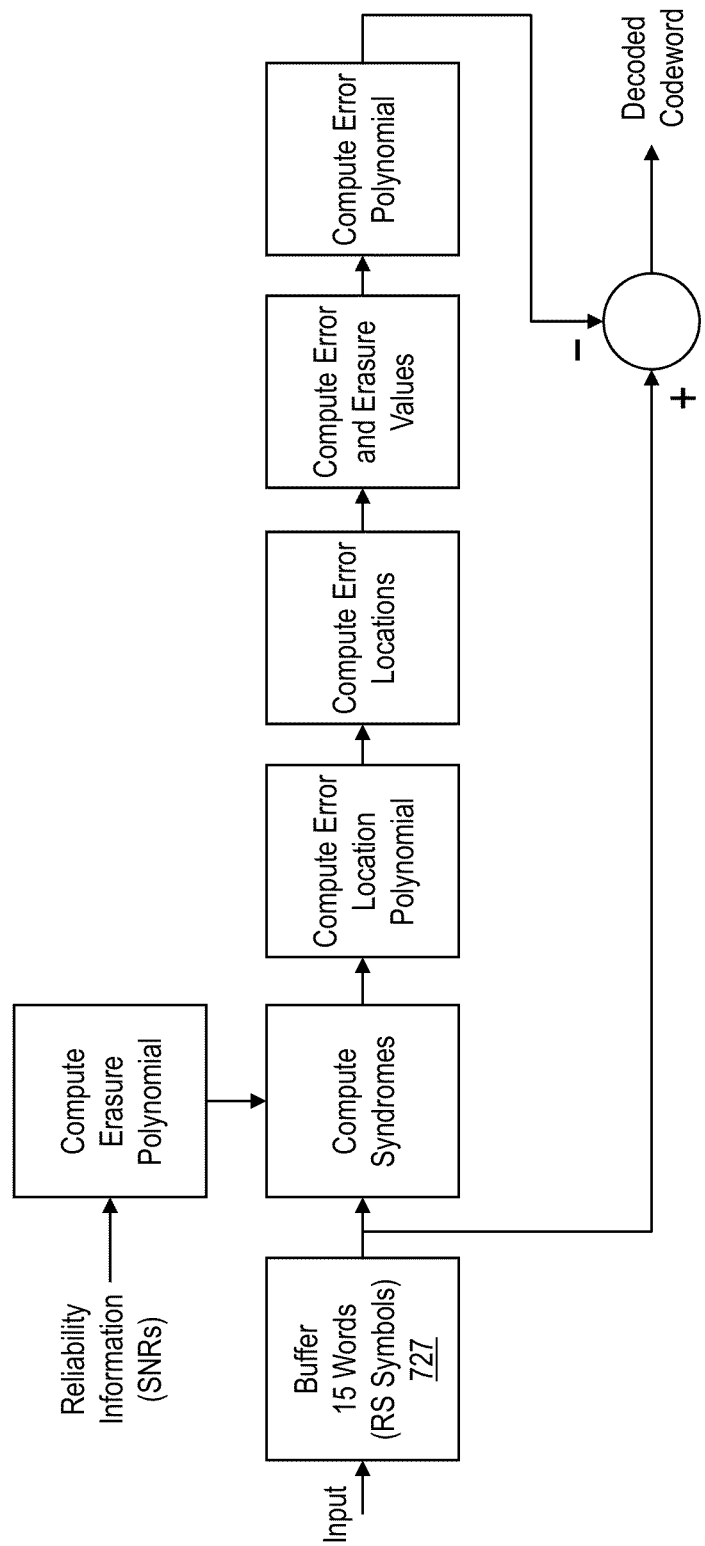
FIG. 10B illustrates an RS decoding process employing a conventional Euclidian algorithm, in accordance with an exemplary embodiment.

FIG. 10B illustrates a Reed-Solomon decoding process employing a conventional Euclidian algorithm, in accordance with an exemplary embodiment. By way of example, considering a polynomial r(x), such that there are v symbol errors at positions $X^{i_1}, X^{i_2}, \ldots X^{i_v}$ and e symbol erasures at positions $X^{j_1}, X^{j_2}, X^{j_e}$, because the locations of the erased positions are known apriori, decoding achieves the locations and values of the errors and values of the erasures. The erasure location numbers corresponding to the erased positions at $X^{j_1}, X^{j_2}, X^{j_e}$ are $\alpha^{j_1}\alpha^{j_2}, \ldots, \alpha^{j_e}$. The erasure polynomial can be represented by:

$$\beta(x) = \prod_{i=1}^{e}(1-\alpha^{j_i}X)$$

Further, the Euclidean algorithm for errors and erasures decoding follows the following steps:
1. Compute the erasure location polynomial β(x) based on the knowledge of the location of the erasures.
2. Form the modified received polynomial r*(x) by replacing the erased symbols in the received polynomial by zeros.
3. Compute the syndromes S1 to S6, based on the modified received polynomial r*(x).
4. Let T(x) be the modified syndrome polynomial—T(x)=[β(x)S(X)] mod $X^6$.
5. Set the following initial conditions:

$$\Omega^{-1}(X)=X^6$$

$$\Omega^0(X)=T(X)$$

$$\zeta^{-1}(X)=\sigma^0(X)=1$$

$$\zeta^0(X)=\sigma^{-1}(X)=0$$

6. The Euclidian algorithm is then applied as described in the previous section until a step k is reached, wherein:

$$\deg \Omega^k(X) < 3+e/2 \text{ for even } e$$

or $$\deg \Omega^k(X) < 3+(e-1)/2 \text{ for odd } e$$

7. If k≤(2t−e), and the condition in step 6 is met, then set $\Omega(X)=\Omega^{(k)}(X)$ and $\sigma(X)=\Omega^{(k)}(X)$, otherwise declare a decoding failure and stop decoding.
8. Find the roots of σ(X), and from there the error locations can be obtained, as follows: If $\sigma(\alpha^i)=0$, then $\alpha^i$ is a root of σ(X) and $\alpha^{15-i}$ is an error location number.
9. The values of the errors and erasures are then found using Ω(X) and $\gamma(X)=\sigma(X)\beta(X)$. Then, using Forney's equations the error values are:

$$e_{i_k} = \frac{-\Omega(\alpha^{-i_k})}{\gamma'(\alpha^{-i_k})}$$

and the erasure values are:

$$e_{j_l} = \frac{-\Omega(\alpha^{-j_l})}{\gamma'(\alpha^{-j_l})}$$

where 1≤k≤v and 1≤l≤e.
10. If there are v error locations found then the error polynomial can be written as:

$$e(x) = \sum_{k=1}^{v} e_{i_k} X^{\alpha_{i_k}}$$

11. The decoded codeword is then v(x)=r*(x)−e(x).

Transmitter Performance

Figure 11A:
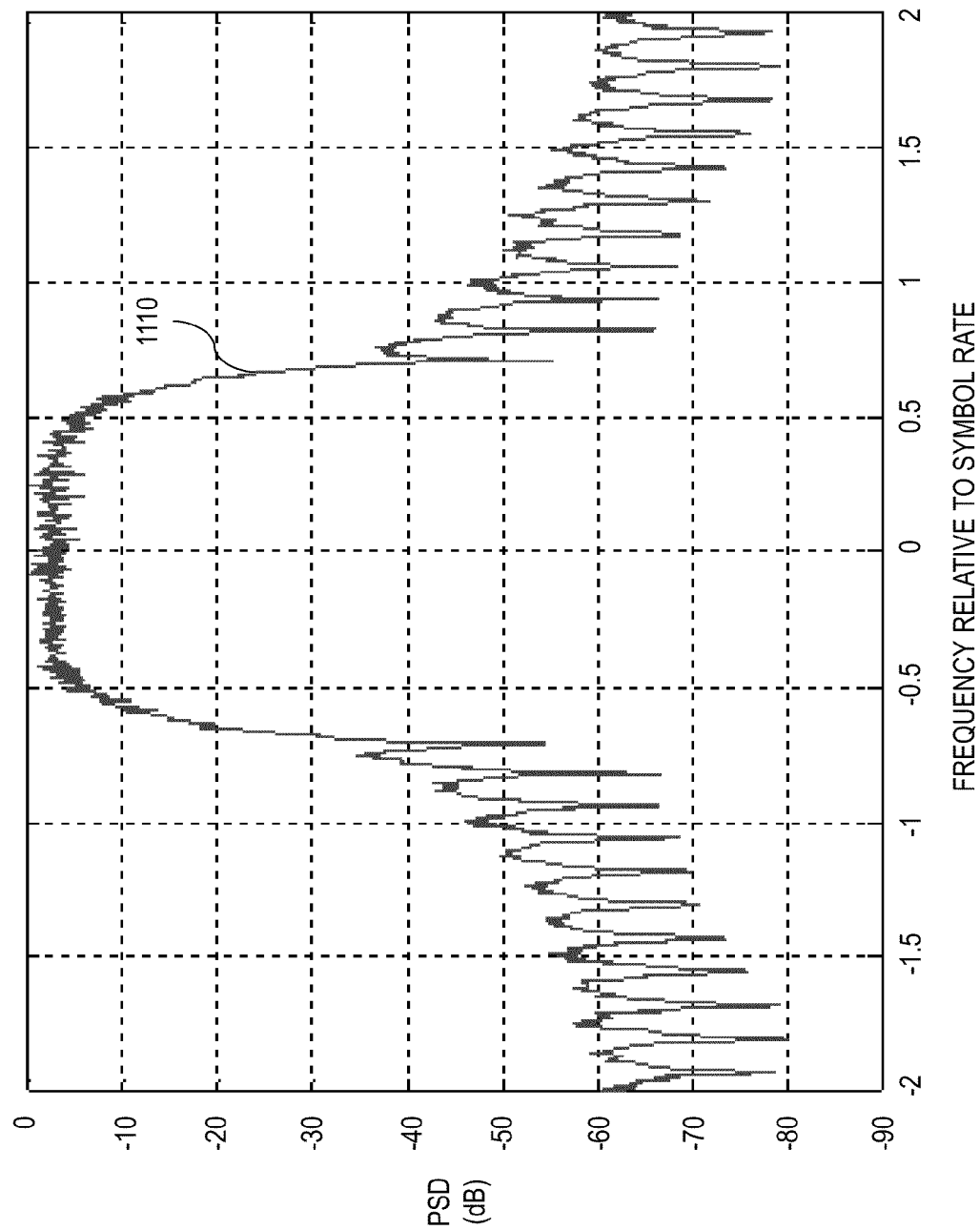
FIG. 11A illustrates a power spectrum density (PSD) plot of an alert message burst which has been coded utilizing a Reed-Solomon outer coding and an orthogonal sequence with scrambling, in accordance with an exemplary embodiment.

FIG. 11A illustrates a power spectrum density (PSD) plot 1110 of an alert message burst which has been coded utilizing a Reed-Solomon outer coding and an orthogonal sequence with scrambling, in accordance with an exemplary embodiment. Further, FIG. 11B illustrates a power spectrum density (PSD) plot 1112 of an alert message burst which has been coded utilizing a Reed-Solomon outer coding (in accordance with an exemplary embodiment) and a conventional orthogonal sequence without scrambling. As is evident from an analysis of PSD plot for the alert message burst depicted in FIG. 11A, where the burst was coded with the application of the Reed-Solomon outer coding and orthogonal sequences with scrambling (in accordance with embodiments of the present invention) the PSD plot is regular and uniform. By contrast, the PSD plot for the alert message burst depicted in FIG. 11B, where the burst was coded with the application of convention orthogonal sequences without scrambling, exhibits and uneven PSD. Hence, alert message bursts coded with the application of conventional orthogonal sequences are thus vulnerable to amplifier nonlinearity.

Moreover, the peak-to-Average-ratio (PAR) of alert message bursts modulated based on a π/2 BPSK modulation scheme (in conjunction with scrambled binary orthogonal sequences), in accordance with exemplary embodiments of the present invention, is about 1.84 dB, which is significantly lower than that of alert message bursts modulated based on conventional PSK modulation (e.g., BPSK, QPSK, 6 PSK, MPSK). Moreover, compared to the 6 PSK modulation employed for alert message bursts in current mobile communications systems, the use of π/2 BPSK modulation reduces the PAR by more than 2 dB. This reduction in PAR facilitates a smaller amplifier back-off, and thus improved amplifier efficiency and improved link margin in the system. A comparison of the PARs for signals modulated based on the π/2 BPSK modulation of embodiments of the present invention against signals based on such conventional modulation schemes is summarized in the following table:

| Modulation | π/2 BPSK | PSK (BPSK, QPSK, 6 PSK, MPSK) | π/4 QPSK | 16 QAM | 16 APSK |
|---|---|---|---|---|---|
| PAR (dB) | 1.84 | 3.86 | 3.17 | 6.17 | 4.72 |

Receiver Performance

Figure 11C:
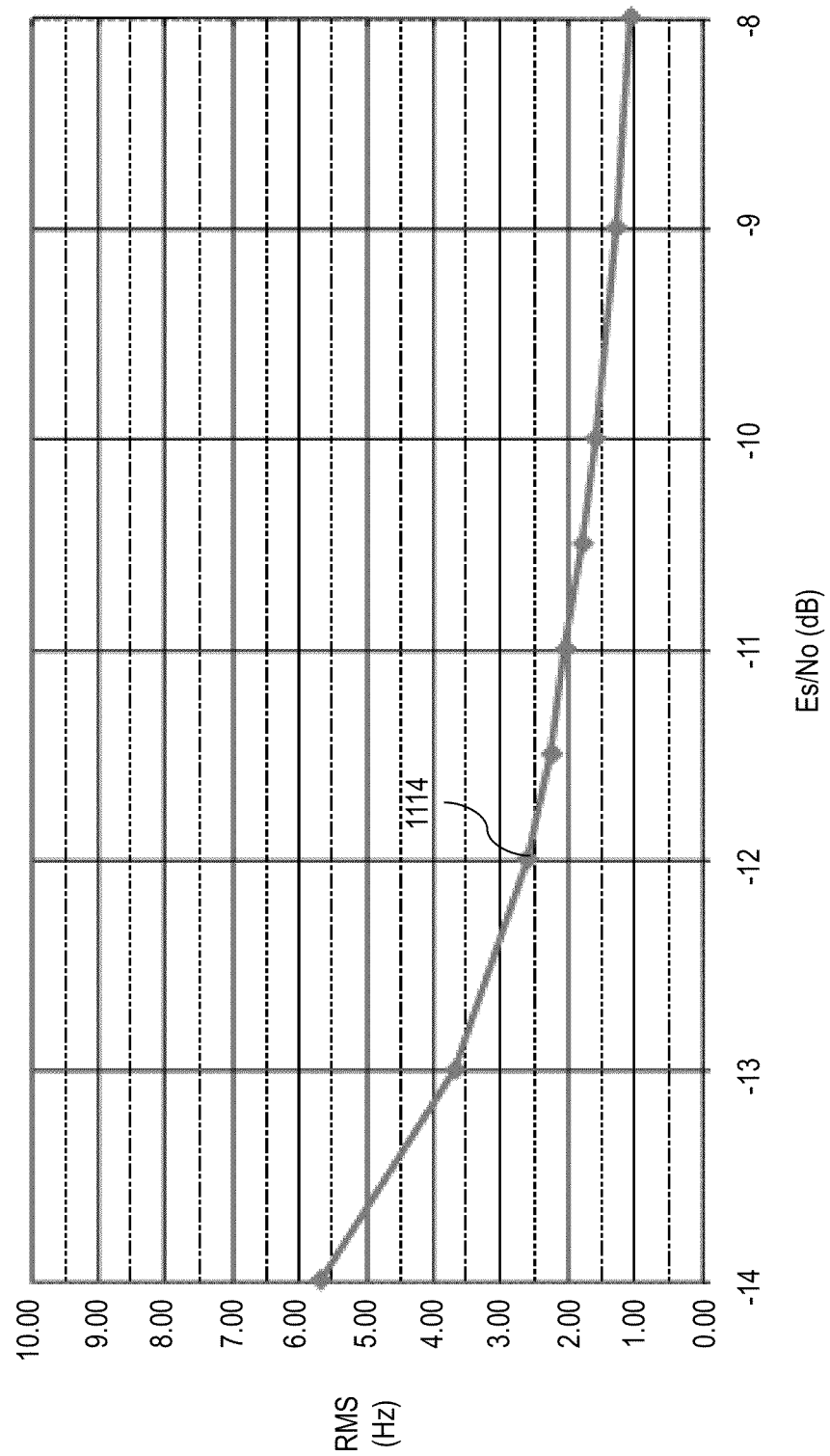
FIG. 11C illustrates a performance plot of a frequency tracking loop implemented in accordance with an exemplary embodiment.
Figure 11D:
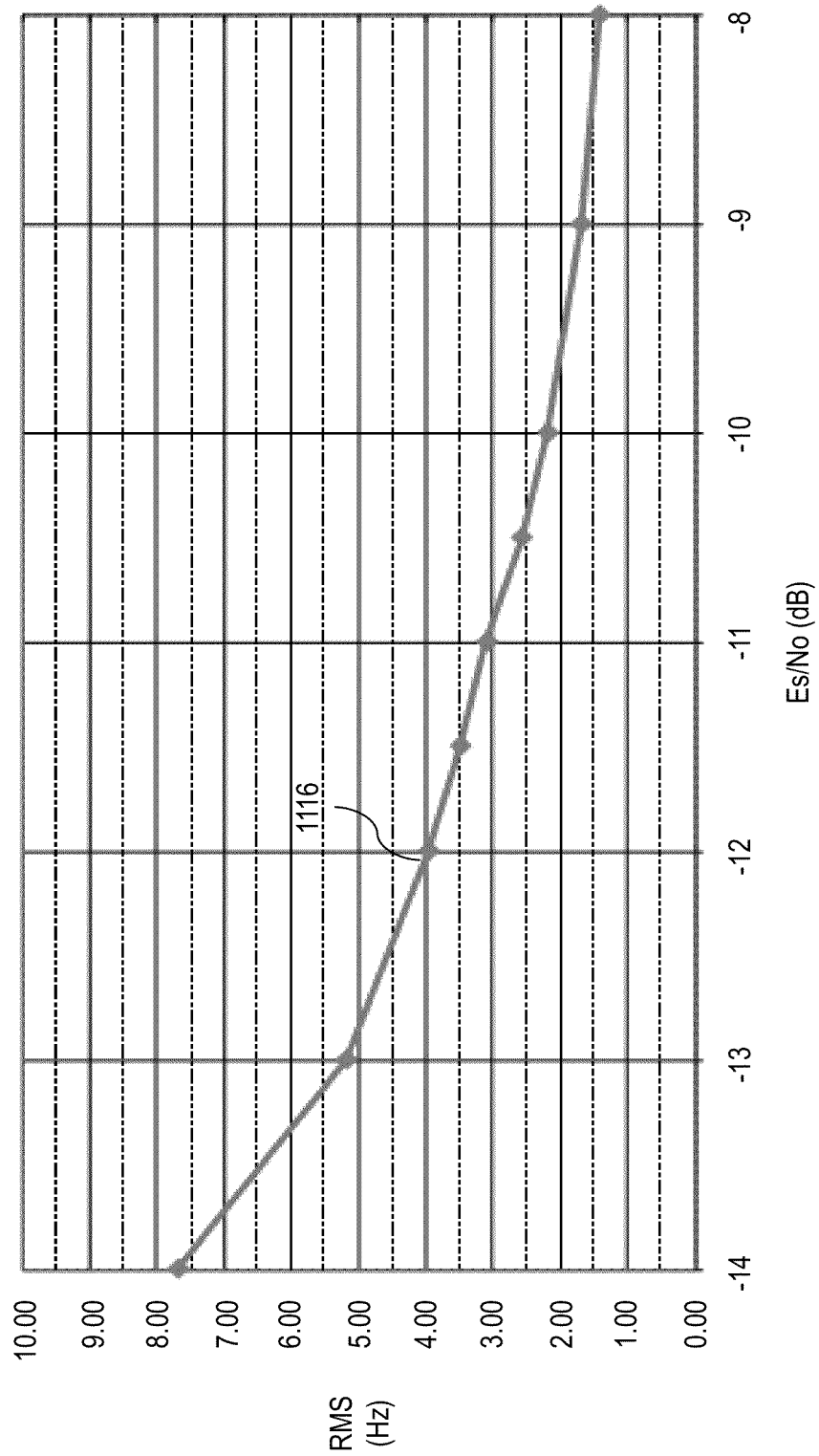
FIG. 11D illustrates a performance plot of a timing tracking loop implemented in accordance with an exemplary embodiment.

FIG. 11C illustrates a performance plot of a frequency tracking loop estimated RMS error in steady state 1114, where the tracking loop is implemented in accordance with an exemplary embodiment of the present invention. Further, FIG. 11D illustrates a performance plot of a timing tracking loop estimated RMS error in steady state 1116, where the tracking loop is implemented in accordance with an exemplary embodiment. As can be seen from the plots, at an Es/No=−11 dB, the frequency RMS error is less than 2.0 Hz and the timing RMS error is less than 3 μs, in an AWGN channel.

Figure 11E:
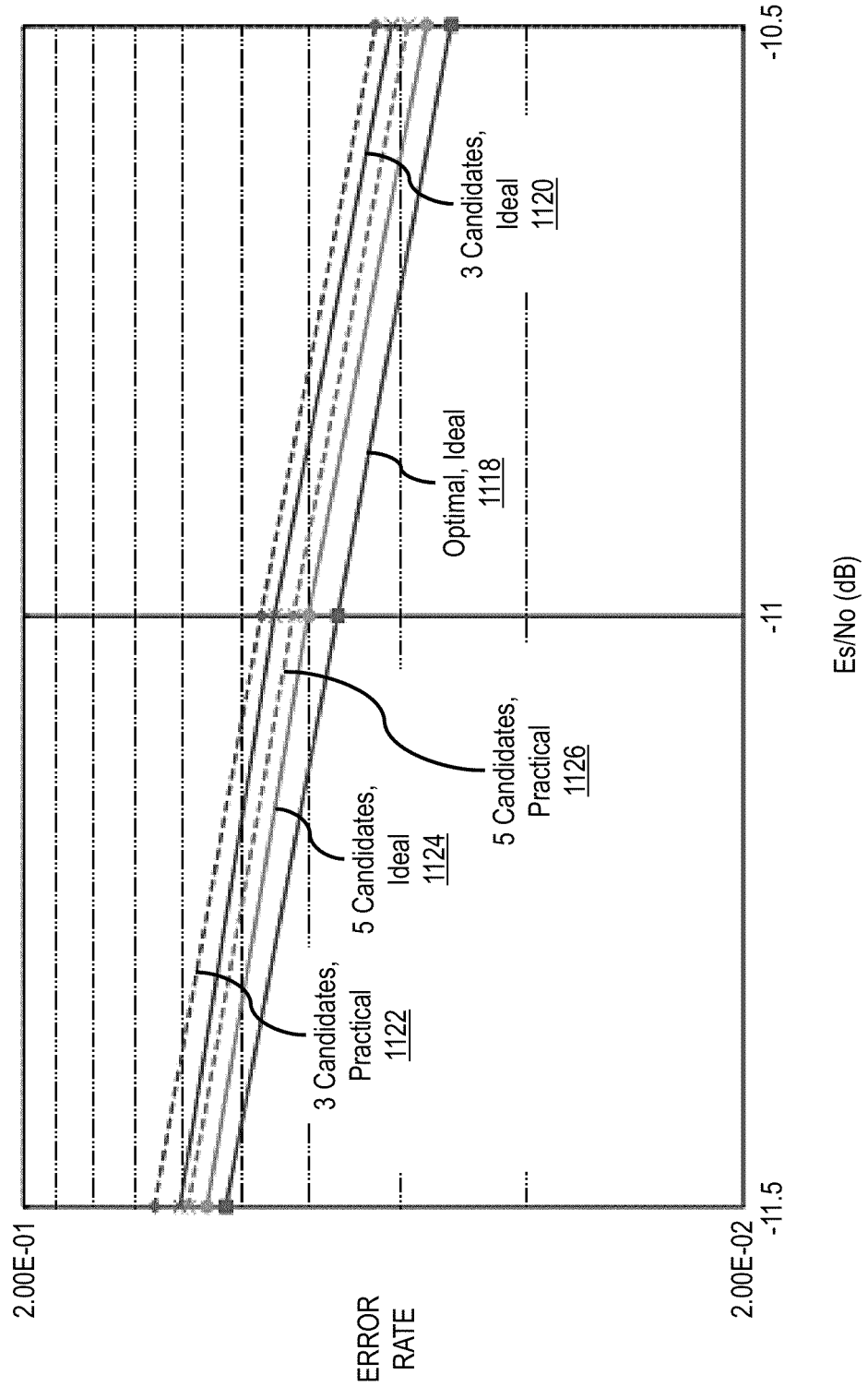
FIG. 11E illustrates a plot of the sequence error detection performance, over an AWGN channel, comparing the performance variations between the optimal use of all 16 candidates in the joint detection against use of 5 candidates and 3 candidates, in accordance with exemplary embodiments.

FIG. 11E illustrates a plot of the sequence error detection performance, over an AWGN channel, comparing the performance variations between the optimal use of all 16 candidates in the joint detection against the use of 5 candidates and 3 candidates, in accordance with exemplary embodiments. The use of fewer candidates reduces the computational complexity and delay of the receiver. The plot illustrates the probabilities of the receiver selecting a wrong sequence out of 16, 5 and 3 candidates, which is reflected as symbol error probability (SER) and is equivalent to an RS symbol error rate before RS decoding. Further, the plots are shown under both ideal and practical circumstances, where ideal cases reflect an ideal receiver with no timing or frequency errors, and the practical cases reflect a receiver exhibiting residual timing and frequency errors (as illustrated in FIGS. 11C and 11D). With reference to FIG. 11E, the plot 1118 depicts the optimal case of 16 candidates under ideal conditions, the plot 1120 depicts the case of 3 candidates under ideal conditions, the plot 1122 depicts the case of 3 candidates under practical conditions, the plot 1124 depicts the case of 5 candidates under ideal conditions, and the plot 1126 depicts the case of 5 candidates under practical conditions. As is evident from the plots, the performance difference between the optimum (all 16 candidates) case and the case using 5 candidates in the joint detection with ideal receiver is less than 0.1 dB in an AWGN channel, and the performance difference between the case of using 5 candidates and the case of using 3 candidates is less than another 0.1 dB. Further, the difference between the practical and ideal situations is very small, about 0.1 dB in an AWGN channel. As a result, the change from 16 down to 5 candidates in the joint detection algorithm results in a significant reduction in receiver complexity, while not sacrificing any significant level of performance, whereas a further reduction down to 3 candidates does not achieve any further significant reduction in complexity to justify a further reduction in performance. Accordingly, employment of the transmission waveform and the receiver joint detection algorithms in accordance with exemplary embodiments of the present invention facilitates the use of fewer candidates in the joint detection algorithm (e.g., 5 candidates), without a significant sacrifice in performance, which results in a significant reduction in receiver complexity.

Figure 11F:
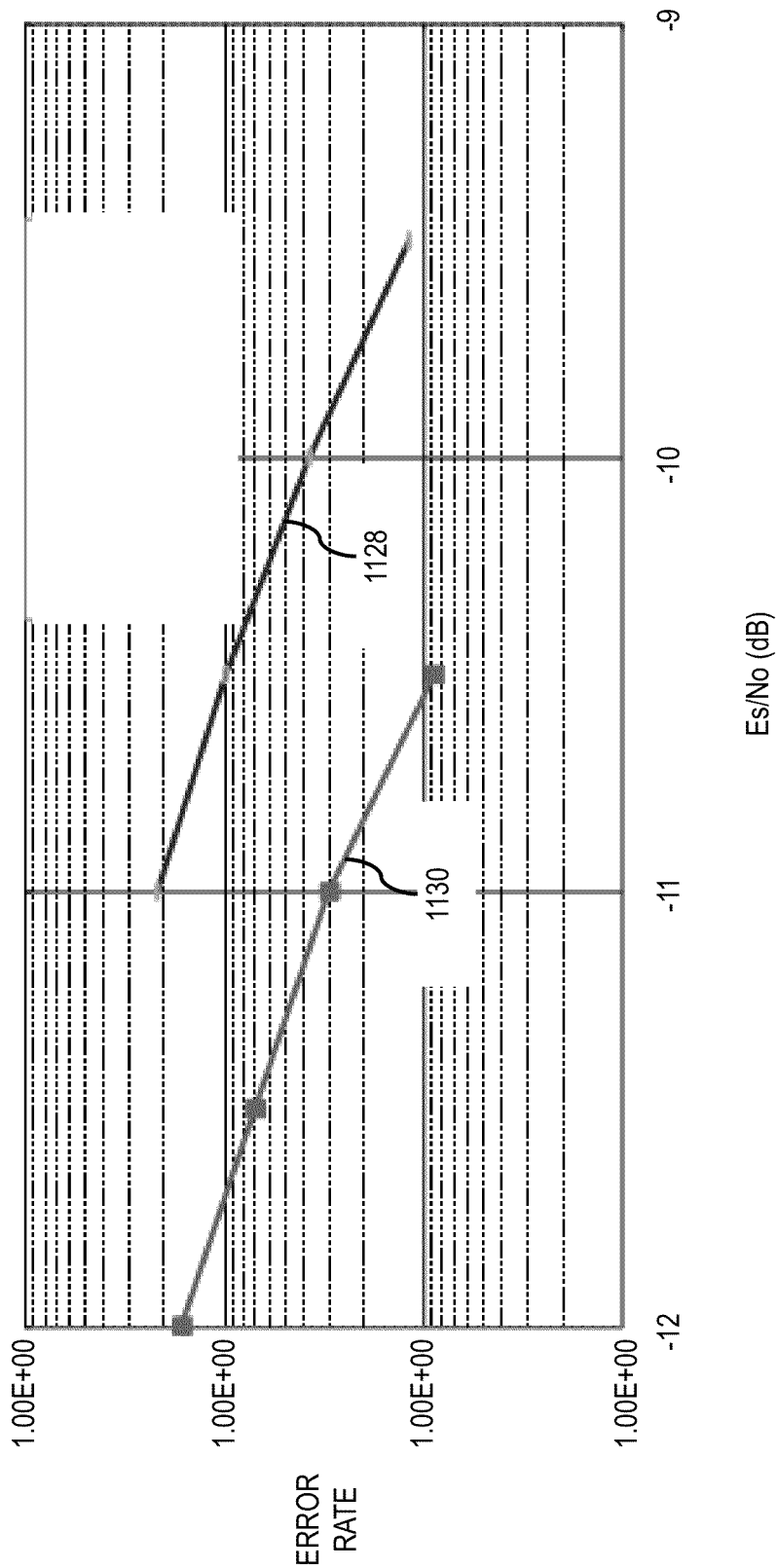
FIG. 11F illustrates a plot of the alert message error performance, comparing the alert message error rates between an exemplary embodiment and the conventional alert messaging approach.

FIG. 11F illustrates a plot of the alert message error performance in an AWGN channel, comparing the alert message error rates between an exemplary embodiment and the conventional alert messaging approach. The alert message error rate performance depicted in FIG. 11F reflects an implementation in accordance with exemplary embodiments of the present invention, employing a practical joint sequence detection and iterative error & erasure RS decoder up to 4 erasures. With reference to FIG. 11F, for example, a message error rate of 5% is achieved at a received Es/No of −11.3 dB. Further, as depicted in FIG. 11F, the enhancement in message error performance achieved by the alerting approaches of exemplary embodiments of the present invention is about 1.3 dB better than that of current systems. Moreover, considering the PAR advantage more than 2 dB (described above), embodiments of the present invention achieve a net link margin gain of more than 3.3 dB.

Figure 12:
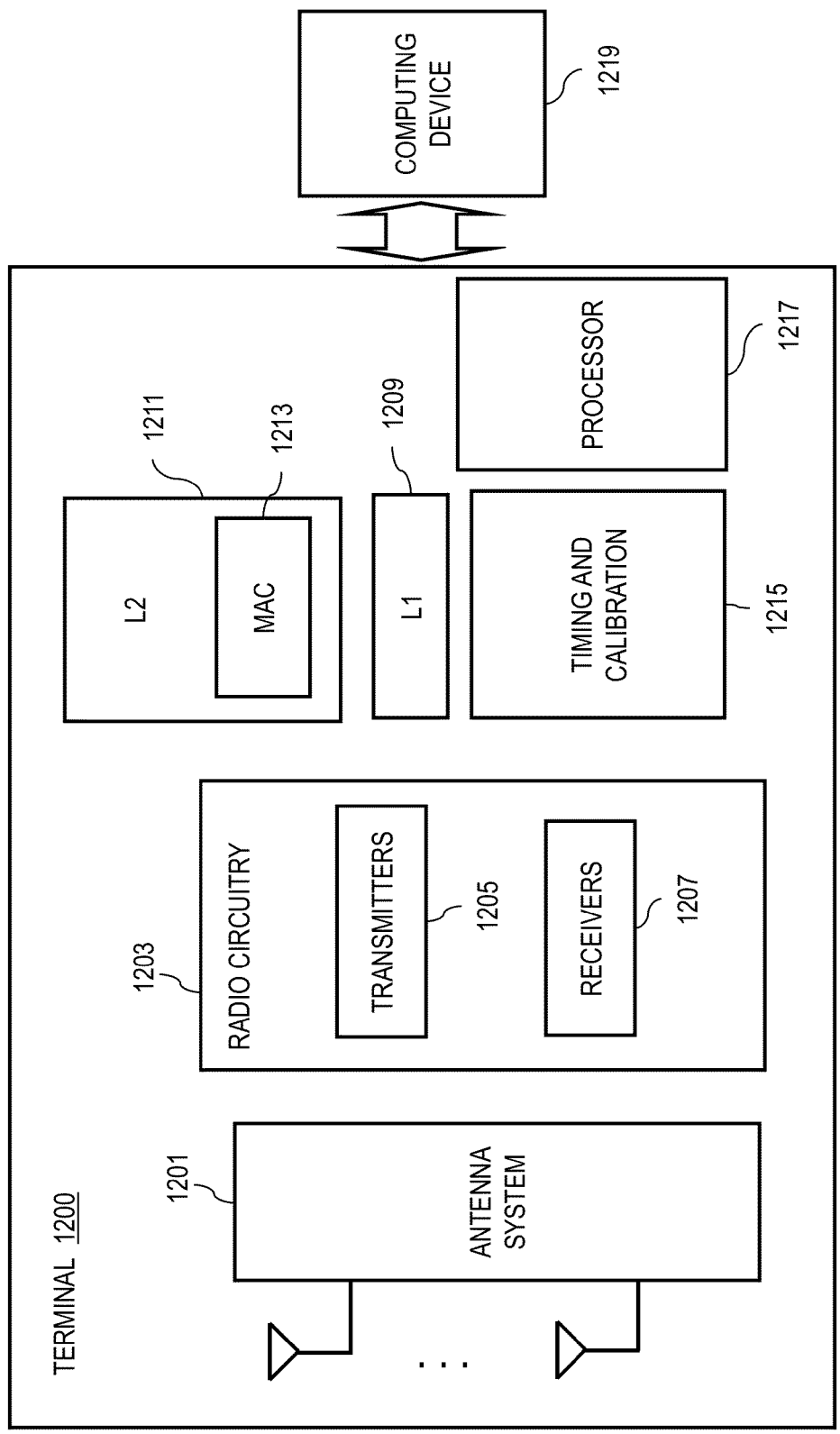
FIG. 12 illustrates a block diagram of exemplary components of a user terminal configured to operate in the systems of FIGS. 1A and 1B, according to an exemplary embodiment.

FIG. 12 illustrates a block diagram of exemplary components of a user terminal configured to operate in the systems of FIGS. 1 and 2, according to an exemplary embodiment. A user terminal 1200 includes an antenna system 1201 (which can utilize multiple antennas) to receive and transmit signals. The antenna system 1201 is coupled to radio circuitry 1203, which includes multiple transmitters 1205 and receivers 1207. The radio circuitry encompasses all of the Radio Frequency (RF) circuitry as well as base-band processing circuitry. As shown, layer-1 (L1) and layer-2 (L2) processing are provided by units 1209 and 1211, respectively. Optionally, layer-3 functions can be provided (not shown). Module 1213 executes all Medium Access Control (MAC) layer functions. A timing and calibration module 1215 maintains proper timing by interfacing, for example, an external timing reference (not shown). Additionally, a processor 1217 is included. Under this scenario, the user terminal 1200 communicates with a computing device 1219, which can be a personal computer, work station, a Personal Digital Assistant (PDA), web appliance, cellular phone, etc.

Figure 13:
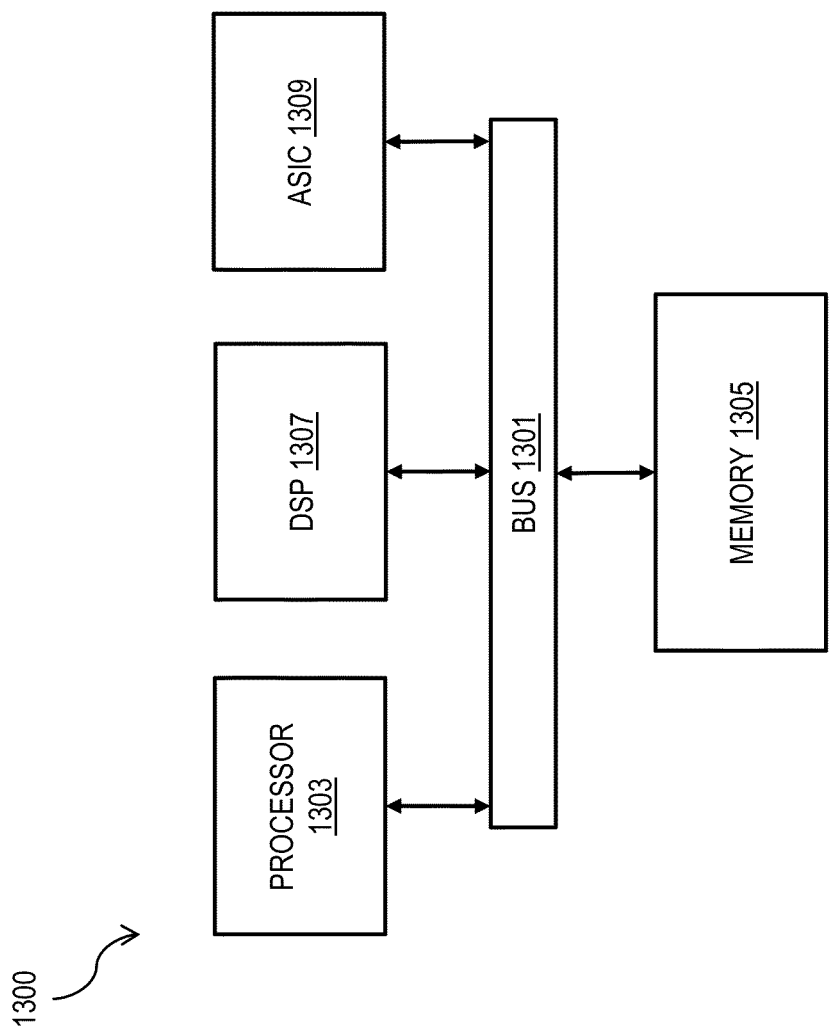
FIG. 13 illustrates a chip set with respect to which embodiments of the invention may be implemented.

FIG. 13 illustrates a chip set 1300 with respect to which embodiments of the invention may be implemented. Chip set 1300 includes, for instance, processor and memory components described with respect to FIG. 13 incorporated in one or more physical packages. By way of example, a physical package includes an arrangement of one or more materials, components, and/or wires on a structural assembly (e.g., a baseboard) to provide one or more characteristics such as physical strength, conservation of size, and/or limitation of electrical interaction.

In one embodiment, the chip set 1300 includes a communication mechanism such as a bus 1301 for passing information among the components of the chip set 1300. A processor 1303 has connectivity to the bus 1301 to execute instructions and process information stored in, for example, a memory 1305. The processor 1303 includes one or more processing cores with each core configured to perform independently. A multi-core processor enables multiprocessing within a single physical package. Examples of a multi-core processor include two, four, eight, or greater numbers of processing cores. Alternatively or in addition, the processor 1303 includes one or more microprocessors configured in tandem via the bus 1301 to enable independent execution of instructions, pipelining, and multithreading. The processor 1303 may also be accompanied with one or more specialized components to perform certain processing functions and tasks such as one or more digital signal processors (DSP) 1307, and/or one or more application-specific integrated circuits (ASIC) 1309. A DSP 1307 typically is configured to process real-world signals (e.g., sound) in real time independently of the processor 1303. Similarly, an ASIC 1309 can be configured to performed specialized functions not easily performed by a general purposed processor. Other specialized components to aid in performing the inventive functions described herein include one or more field programmable gate arrays (FPGA) (not shown), one or more controllers (not shown), or one or more other special-purpose computer chips.

The processor 1303 and accompanying components have connectivity to the memory 1305 via the bus 1301. The memory 1305 includes both dynamic memory (e.g., RAM) and static memory (e.g., ROM) for storing executable instructions that, when executed by the processor 1303 and/or the DSP 1307 and/or the ASIC 1309, perform the process of exemplary embodiments as described herein. The memory 1305 also stores the data associated with or generated by the execution of the process.

Figure 14:
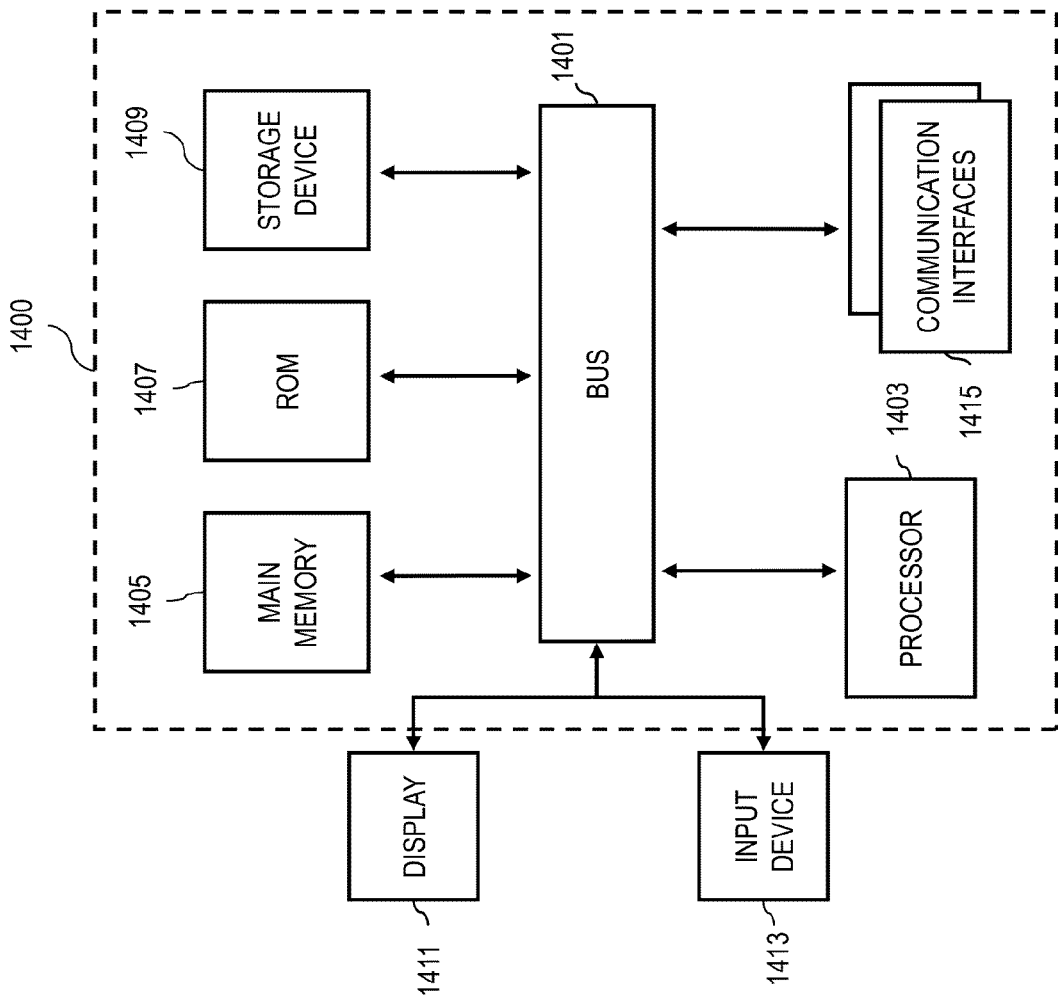
FIG. 14 illustrates a block diagram of hardware that can be used to implement certain exemplary embodiments.

FIG. 14 illustrates a block diagram of exemplary hardware that can be used to implement certain exemplary embodiments. A computing system 1400 includes a bus 1401 or other communications mechanism for communicating information and a processor 1403 coupled to the bus 1401 for processing information. The computing system 1400 also includes main memory 1405, such as a random access memory (RAM) or other dynamic storage device, coupled to the bus 1401 for storing information and instructions to be executed by the processor 1403. Main memory 1405 can also be used for storing temporary variables or other intermediate information during execution of instructions by the processor 1403. The computing system 1400 may further include a read only memory (ROM) 1407 or other static storage device coupled to the bus 1401 for storing static information and instructions for the processor 1403. A storage device 1409, such as a magnetic disk or optical disk, is coupled to the bus 1401 for persistently storing information and instructions.

The computing system 1400 may be coupled via the bus 1401 to a display 1411, such as a liquid crystal display, or active matrix display, for displaying information to a user. An input device 1413, such as a keyboard including alphanumeric and other keys, may be coupled to the bus 1401 for communicating information and command selections to the processor 1403. The input device 1413 can include a cursor control, such as a mouse, a trackball, or cursor direction keys, for communicating direction information and command selections to the processor 1403 and for controlling cursor movement on the display 1411.

According to various embodiments of the invention, the processes described herein can be provided by the computing system 1400 in response to the processor 1403 executing an arrangement of instructions contained in main memory 1405. Such instructions can be read into main memory 1405 from another computer-readable medium, such as the storage device 1409. Execution of the arrangement of instructions contained in main memory 1405 causes the processor 1403 to perform the process steps described herein. One or more processors in a multi-processing arrangement may also be employed to execute the instructions contained in main memory 1405. In alternative embodiments, hard-wired circuitry may be used in place of or in combination with software instructions to implement the embodiment of the invention. In another example, reconfigurable hardware such as Field Programmable Gate Arrays (FPGAs) can be used, in which the functionality and connection topology of its logic gates are customizable at run-time, typically by programming memory look up tables. Thus, embodiments of the invention are not limited to any specific combination of hardware circuitry and software.

The computing system 1400 also includes at least one communications interface 1415 coupled to bus 1401. The communications interface 1415 provides a two-way data communications coupling to a network link (not shown). The communications interface 1415 sends and receives electrical, electromagnetic, or optical signals that carry digital data streams representing various types of information. Further, the communications interface 1415 can include peripheral interface devices, such as a Universal Serial Bus (USB) interface, a PCMCIA (Personal Computer Memory Card International Association) interface, etc.

The processor 1403 may execute the transmitted code while being received and/or store the code in the storage device 1409, or other non-volatile storage for later execution. In this manner, the computing system 1400 may obtain application code in the form of a carrier wave.

The term "computer-readable medium" as used herein refers to any medium that participates in providing instructions to the processor 1403 for execution. Such a medium may take many forms, including but not limited to non-volatile media, volatile media, and transmission media. Non-volatile media include, for example, optical or magnetic disks, such as the storage device 1409. Volatile media include dynamic memory, such as main memory 1405. Transmission media include coaxial cables, copper wire and fiber optics, including the wires that comprise the bus 1401. Transmission media can also take the form of acoustic, optical, or electromagnetic waves, such as those generated during radio frequency (RF) and infrared (IR) data communications. Common forms of computer-readable media include, for example, a floppy disk, a flexible disk, hard disk, magnetic tape, any other magnetic medium, a CD-ROM, CDRW, DVD, any other optical medium, punch cards, paper tape, optical mark sheets, any other physical medium with patterns of holes or other optically recognizable indicia, a RAM, a PROM, and EPROM, a FLASH-EPROM, any other memory chip or cartridge, a carrier wave, or any other medium from which a computer can read.

Various forms of computer-readable media may be involved in providing instructions to a processor for execution. For example, the instructions for carrying out at least part of the invention may initially be borne on a magnetic disk of a remote computer. In such a scenario, the remote computer loads the instructions into main memory and sends the instructions over a telephone line using a modem. A modem of a local system receives the data on the telephone line and uses an infrared transmitter to convert the data to an infrared signal and transmit the infrared signal to a portable computing device, such as a personal digital assistant (PDA) or a laptop. An infrared detector on the portable computing device receives the information and instructions borne by the infrared signal and places the data on a bus. The bus conveys the data to main memory, from which a processor retrieves and executes the instructions. The instructions received by main memory can optionally be stored on storage device either before or after execution by processor.

According to the preceding, various exemplary embodiments have been described with reference to the accompanying drawings. The example embodiments, as described above, were chosen and described in order to best explain the principles of the invention and its practical application to thereby enable others skilled in the art to best utilize the invention in various embodiments and with various modifications as are suited to the particular use contemplated. The specification and drawings are accordingly to be regarded in an illustrative rather than restrictive sense. Moreover, it will be evident that various modifications and changes may be made thereto, and additional embodiments may be implemented, without departing from the broader scope of the invention.

encoding each of the outer coded symbols based on an orthogonal sequence inner coding to generate a respective inner coded symbol, wherein each outer coded symbol is coded based on a distinct corresponding one of a plurality of binary orthogonal sequences; and modulating the inner coded symbols based on a binary modulation scheme, and pulse shaping the modulated inner coded symbols to generate a plurality of message bursts for transmission to the wireless terminal; and wherein each message burst reflects a group of a uniform number of the inner coded symbols, wherein the grouping of the inner coded symbols within the message bursts facilitates joint sequence detection by a receiver of the wireless terminal, and wherein each message burst exhibits relatively low peak-to-average power ratio.

2. The method of claim 1, wherein the binary modulation scheme comprises one of binary phase shift keying (BPSK), π/2 BPSK, quadrature phase shift keying (QPSK), and offset quadrature phase shift keying (OQPSK).

3. The method of claim 1, wherein the encoding of the outer coded symbols further comprises scrambling each message burst based on a binary scrambling sequence.

4. The method of claim 1, wherein the distinct corresponding binary orthogonal sequence, based upon which each outer coded symbol is encoded, is based on a value of the respective outer coded symbol.

5. The method of claim 4, wherein each outer coded symbol is four bits in length, and the orthogonal sequence inner coding comprises a 16-ary coding based on sixteen binary orthogonal sequences with each sequence corresponding to a respective one of the potential four-bit values of the outer coded symbols.

6. The method of claim 5, wherein the sixteen four-bit value outer coded symbol values and corresponding binary orthogonal sequences are as follows:

| 4-Bit Outer Coded Symbol Value | Binary Orthogonal Sequences (76 elements per Sequence) |
| --- | --- |
| 0000 | 0001001100001111001100000000111111001111111100111111000000001100111100001100 |
| 0001 | 0011000100110000111100110000000011111100111111100111111000000001100111110000 |
| 0010 | 0000001100010011000011110011000000000111111001111111100111111000000011001111 |
| 0011 | 0011110000110001001100001111001100000000111111001111111100111111000000001100 |
| 0100 | 0011001111000011000100110001001100001111001100000000111111001111111100000000 |
| 0101 | 0000001100111100001100010011000110011000000001111111001111111100111111100000 |
| 0110 | 0000000001100111100001100010011000110011000110011000110010000001111100111111 |
| 0111 | 0011110000000011000111100001100010011000110011000110011000110011111111110011 |
| 1000 | 1111000000111111110011000011100011101001110000100111111110000001100000000000 |
| 1001 | 1100001100000111111110011000011110011101100111000011001111111100000110000000 |
| 1010 | 1100000000110000001111111001100001110011011001111000011001111111100000011000 |
| 1011 | 1100110000000011000000111111001100011000111000110110011110000010011111111000 |
| 1100 | 1100000011000000011000111111110001100110000011100011110000011100001100111111 |
| 1101 | 1111110000001100000000110000001111111001100001110011011001111000011001111111 |
| 1110 | 1111111111000000110000000011000000111111110010000111100111011001110011100100 |
| 1111 | 1111001111111000000011000000001100000111111100110000111100111011001110011100 |

What is claimed is:

1. A method comprising:
   generating, by a processor, a message for transmission to a wireless terminal, wherein the message comprises a number of bits;
   partitioning the message into a number of symbols, each symbol being composed of a distinct equal length portion of the message;
   encoding the symbols via an FEC outer coding to generate a number of outer coded symbols;

7. The method of claim 6, wherein the encoding of the outer coded symbols further comprises scrambling each message burst based on a 228-bit binary scrambling sequence, as follows:

0001001100011011110001000010010100001111100011 0000010101111
0111111001101011010101110110010011001011011100100011011010
0001111011011000001010010010000001100011100000010000101111

11110000011010101011111101100110010101010010001000110

8. The method of claim 7, wherein the message comprises 36 information bits, the message is partitioned into nine 4-bit symbols, the FEC outer coding generates fifteen 4-bit outer coded symbols, and each message burst reflects a group of three of the inner coded symbols.

9. The method of claim 8, wherein the binary modulation scheme comprises a π/2 BPSK scheme applied as follows:

$$S_j = (-1)^{d_j} * e^{jl(\pi/2)}$$

where $d_j$ denotes the scrambled bits, and $S_j$ denotes the π/2 BPSK modulated symbol, and the outer coding comprises a Reed-Solomon (15,9) outer code, with a Galois field of $2^4$ (GF($2^4$)).

10. An apparatus comprising:

a processor module configured to generate a message for transmission to a wireless terminal, wherein the message comprises a number of bits, and to partition the message into a number of symbols, each symbol being composed of a distinct equal length portion of the message;

an encoder module configured to encode the symbols via an FEC outer coding to generate a number of outer coded symbols, and to encode each of the outer coded symbols based on an orthogonal sequence inner coding to generate a respective inner coded symbol, wherein each outer coded symbol is coded based on a distinct corresponding one of a plurality of binary orthogonal sequences; and a modulator module configured to modulate the inner coded symbols based on a binary modulation scheme; and one or more pulse shaping filters to pulse shape the modulated inner coded symbols to generate a plurality of message bursts for transmission to the wireless terminal; and wherein each message burst reflects a group of a uniform number of the inner coded symbols, wherein the grouping of the inner coded symbols within the message bursts facilitates joint sequence detection by a receiver of the wireless terminal, and wherein each message burst exhibits relatively low peak-to-average power ratio.

11. The apparatus of claim 10, wherein the binary modulation scheme comprises one of binary phase shift keying (BPSK), π/2 BPSK, quadrature phase shift keying (QPSK), and offset quadrature phase shift keying (OQPSK).

12. The apparatus of claim 10, wherein, as part of the encoding of the outer coded symbols, the encoder is further configured to scramble each message burst based on a binary scrambling sequence.

13. The apparatus of claim 10, wherein the distinct corresponding binary orthogonal sequence, based upon which each outer coded symbol is encoded, is based on a value of the respective outer coded symbol.

14. The apparatus of claim 13, wherein each outer coded symbol is four bits in length, and the orthogonal sequence inner coding comprises a 16-ary coding based on sixteen binary orthogonal sequences with each sequence corresponding to a respective one of the potential four-bit values of the outer coded symbols.

15. The apparatus of claim 14, wherein the sixteen four-bit value outer coded symbol values and corresponding binary orthogonal sequences are as follows:

| 4-Bit Outer Coded Symbol Value | Binary Orthogonal Sequences (76 elements per Sequence) |
| --- | --- |
| 0000 | 0001001100001111001100000000111111001111111100111110000000110011110000110011 |
| 0001 | 0011000100110000111100110000000011111100111111100111111000000000110011110000 |
| 0010 | 0000001100010011000011100110000000011111100111111110011111110000000011001111 |
| 0011 | 0011110000110010011000011100110000000111111100111111110011111110000000011100 |
| 0100 | 0011001111000011000100110001111001100000000111111001111111100111110000000000 |
| 0101 | 0000001100111100001100100100001111001100000000111111001111111001111111110000 |
| 0110 | 0000000001100111100001100100010000111100110000000011111100111111111100111111 |
| 0111 | 0011110000000011001111000011000100110001111001100000000111111001111111110011 |
| 1000 | 1111000000111111110011000011100111011001111000011001111111110000001100000000 |
| 1001 | 1100001100000011111111001100001111001100110011001001001111111110000000110000 |
| 1010 | 1100000000110000001111111100110001111001101100111100000100111111111100000011 |
| 1011 | 1100110000000011000000111111110010000111100111011001110000110011111111110000 |
| 1100 | 1100000011000000001100000011111111001000011110011101100111100000110011111111 |
| 1101 | 1111110000001100000000110000001111111100110000111100110110010011110000110001111 |
| 1110 | 1111111110000000110000000011000000111111111000001110011100111011000111000001100 |
| 1111 | 1111001111111000000110000000011000000111111110010000011100111011001110000. |

16. The apparatus of claim 15, wherein, as part of the encoding of the outer coded symbols, the encoder is further configured to scramble each message burst based on a 228-bit binary scrambling sequence, as follows:

000100110001101111000100001001010000111110001100000101011111

011111100110101101010111011001001100101101110001000110110100

000111011011000001010010010000000110001110000010000101011111

11110000011010101011111101100110010101010010001000110

17. The apparatus of claim 16, wherein the message comprises 36 information bits, the message is partitioned into nine 4-bit symbols, the FEC outer coding generates fifteen 4-bit outer coded symbols, and each message burst reflects a group of three of the inner coded symbols.

18. The apparatus of claim 17, wherein the binary modulation scheme comprises a π/2 BPSK scheme applied as follows:

$$S_j = (-1)^{d_j} * e^{jl(\pi/2)}$$

where $d_j$ denotes the scrambled bits, and $S_j$ denotes the π/2 BPSK modulated symbol, and the outer coding comprises a Reed-Solomon (15,9) outer code, with a Galois field of $2^4$ (GF($2^4$)).

* * * * *